United States Patent [19]

Adams

[11] Patent Number: 4,686,481

[45] Date of Patent: Aug. 11, 1987

[54] PHASE DETECTOR APPARATUS INCLUDING CHARGE PUMP MEANS

[75] Inventor: Neil R. Adams, San Francisco, Calif.

[73] Assignee: Advanced Micro Devices, Inc., Sunnyvale, Calif.

[21] Appl. No.: 697,545

[22] Filed: Feb. 1, 1985

[51] Int. Cl.[4] .................. H03D 13/00; H03K 9/06; H03K 5/13

[52] U.S. Cl. ............................. 328/133; 328/155; 307/511; 307/516; 307/262

[58] Field of Search ............... 307/494, 511, 516, 510, 307/514, 246, 262; 328/133, 134, 127, 155

[56] References Cited

U.S. PATENT DOCUMENTS

| | | | |
|---|---|---|---|
| 3,944,938 | 3/1976 | Browant | 328/134 |
| 3,968,446 | 7/1976 | Thiebout | 328/134 |
| 4,127,824 | 11/1978 | Bennett, Jr. | 328/134 |
| 4,358,736 | 11/1982 | De Boer | 328/133 |
| 4,523,150 | 6/1985 | Hogeboom | 307/511 |
| 4,532,442 | 7/1985 | Black | 307/494 |

Primary Examiner—Stanley D. Miller
Assistant Examiner—Timothy P. Callahan
Attorney, Agent, or Firm—Patrick T. King; Mark A. Haynes; J. Vincent Tortolano

[57] ABSTRACT

An improved phase detector apparatus which includes a charge pump. The charge pump includes a first integrating node and a second integrating node. The first and second integrating nodes generate node voltages which ramp downward and upward during a given period of a reference signal. When a signal is received to which a reference signal is to be locked on, the integrating sequence of the first and second nodes is altered so that the differential voltage across the nodes indicates a difference in phase between the reference signal and the second signal. A filter is connected between the output signal and the first integrating node, while the second integrating node is referenced to a DC bias level and returns to that level at the beginning and end of each cycle. The charge pump apparatus is driven by variable current sources which give the apparatus a variable frequency response. The frequency response is variable over a very wide range by the inclusion of multiple banks of variable current sources which can be switched in and out for driving the charge pump apparatus as desired.

21 Claims, 15 Drawing Figures

PHASE DETECTOR APPARATUS INCLUDING CHARGE PUMP MEANS

CROSS-REFERENCE TO RELATED U.S. PATENT APPLICATION

The present application is related to my prior U.S. patent application entitled "PHASE DETECTOR", filed Apr. 30, 1984, Ser. No. 605,320, now U.S. Pat. No. 4,628,461, and owned at the time of invention and currently by a common assignee.

FIELD OF THE INVENTION

The present invention relates generally to apparatus for comparing two signals and, more particularly, to a phase detector for detecting the difference in phase between a reference frequency signal and a data pulse signal and a phase-locked loop system employing the phase detector.

BACKGROUND OF THE INVENTION

In the processing of information generally, it often is necessary to compare two different signals to accomplish a variety of purposes. The comparison may result in the generation of an error signal representing a difference between the two signals. Circuitry may then respond to the error signal to minimize this difference between the two signals or perform some other function based on this difference, as is needed.

For example, a phase detector is conventionally used to detect the difference in phase between two signals. The phase detector may be used in a phase-locked loop that, among other components, has a voltage controlled oscillator (VCO) whose output is a reference frequency signal having a stream of frequency pulse signals. The phase detector receives a stream of data pulse signals, together with the frequency pulse signals which are fed back from the VCO. Any difference in phase between the data pulse signals and the frequency pulse signals results in the generation of a phase error signal that is filtered and then used to control the VCO so that the frequency pulse signals and the data pulse signals become in phase.

Certain types of data pulse streams, such as those known as MFM disk data, can cause difficulty when inputted to a phase-locked loop via the phase detector. This is because the data pulse stream will have "holes" in it, meaning that there are no data pulse signals in the pulse stream for a given period, such as a "bit time" if the data pulse signals are binary digital signals. As is known, these "missing" data pulse signals can cause the phase detector to malfunction.

A prior approach to avoiding malfunction due to missing data pulse signals is to arm the phase detector only if a data pulse signal occurs and to disarm the phase detector if a data pulse signal does not occur during the bit time. This technique uses a time delay device which receives in real time the stream of data pulse signals and outputs to the phase detector delayed data pulse signals which are to be compared to the frequency pulse signal of the VCO. The phase detector also receives in real time the stream of data pulse signals for arming purposes.

Thus, in operation, the data pulse stream is fed to the input of the time delay device as well as to the phase detector. If a data pulse signal occurs, the phase detector is armed and then, a short time later, receives the same, but delayed, data pulse signal which had been delayed by the time delay device. This delayed data pulse signal is then compared with the frequency pulse signal to produce the phase error signal. However, if no data pulse signal occurs during the bit time, the phase detector is not armed, so that it does not operate for phase detection purposes.

One problem with the prior solution is the requirement of a time delay device. In addition to requiring a time delay device which may be expensive, the delay must be precise, so as to have the phase detector properly compare its two input signals. The realization of such a precision time delay is not always easily accomplished. Also, the delay should be equal to one-half the cycle of the nominal frequency of the VCO. Therefore, if the nominal frequency of the VCO is to be changed, which may require using a different VCO in the phase-locked loop, then a new time delay device may be needed in view of the requirement that the delay be equal to one-half the cycle of the nominal frequency. Still furthermore, the arming and disarming of the phase detector has the disadvantage of causing the phase detector to change state between an operative or armed condition and a non-operative or disarmed condition.

In certain applications of a phase detector, such as in many phase-locked loop systems, it is desirable to maintain the output signal at a level corresponding to an integral of the existing phase error between the two signals in real time for each cycle in which a data pulse occurs. The related U.S. patent application entitled "PHASE DETECTOR" referred to above discloses one circuit for generating such an output signal. Furthermore, the related application discloses an invention which overcomes many of the problems of the above-mentioned prior art phase detectors. The present invention provides an improvement in the phase detector claimed in the related application.

SUMMARY OF THE INVENTION

The present invention accomplishes the generation of an output signal indicating in real time the integral of the phase error between a frequency pulse signal and a data pulse signal and is operable whether or not a data pulse signal occurs during a given data bit period.

In one aspect, the present invention provides an apparatus for generating an output signal in response to a first signal and a second signal. The apparatus comprises a first integrating means for generating a first node voltage in response to switching signals and a second integrating means for generating a second node voltage in response to switching signals. The output signal generated by output means is proportional to the difference between the first node voltage and the second node voltage. Also, a means, responsive to the first signal and the second signal, for generating the switching signals is provided.

A filter means for varying the first node voltage in response to the differences between said first node voltage and said second node voltage is included.

The second integrating means includes an equalizing means, responsive to the switching signals, for setting the second node voltage at a bias voltage.

In a preferred embodiment, the first signal is a data signal having a stream of data pulse signals; and the second signal is a reference frequency signal having a stream of frequency pulse signals that defines a bit period in which a data pulse signal is expected to occur. The apparatus of the present invention is operable whether or not a data pulse signal occurs during the given bit period.

In a further embodiment, the first integrating means and the second integrating means include variable current sources whereby the frequency response of the apparatus can by dynamically varied.

The present invention includes in another aspect, a phase-locked loop apparatus for generating a frequency signal substantially in phase with a data signal. The phase-locked loop apparatus includes a means for detecting differences in phase between the frequency signal and the data signal and having a frequency response that is variable over a plurality of nominal data rates.

BRIEF DESCRIPTION OF THE DRAWINGS

FIGS. 5-13 are detailed circuit diagrams of a preferred implementation of the present invention as an integrated circuit phase detector for a phase-locked loop, in which:

FIG. 5 shows the positive current sources and the first and second integrating nodes;

FIG. 6 shows the negative current sources for the first integrating node;

FIG. 7 shows the negative current sources for the second integrating node and a current source for minimizing drift in the first and second integrating nodes;

FIG. 8 shows the current scaling circuitry for the apparatus;

FIG. 9 shows the biasing circuitry for the current sources of the apparatus;

FIG. 10 shows a clamping circuit utilized in switching the current sources of the present invention;

FIG. 11 shows a switching circuit utilized in switching the current sources of the present invention;

FIG. 12 shows another switching circuit utilized in the apparatus; and

FIG. 13 shows an output driving circuit for the present invention.

DETAILED DESCRIPTION

With reference to the figures, a detailed description of the present invention is provided. First, with reference to FIGS. 1-4, an overview of the present invention is discussed. Then, with reference to the balance of the figures, a detailed circuit implementation is described.

I. Overview

Figure 1:
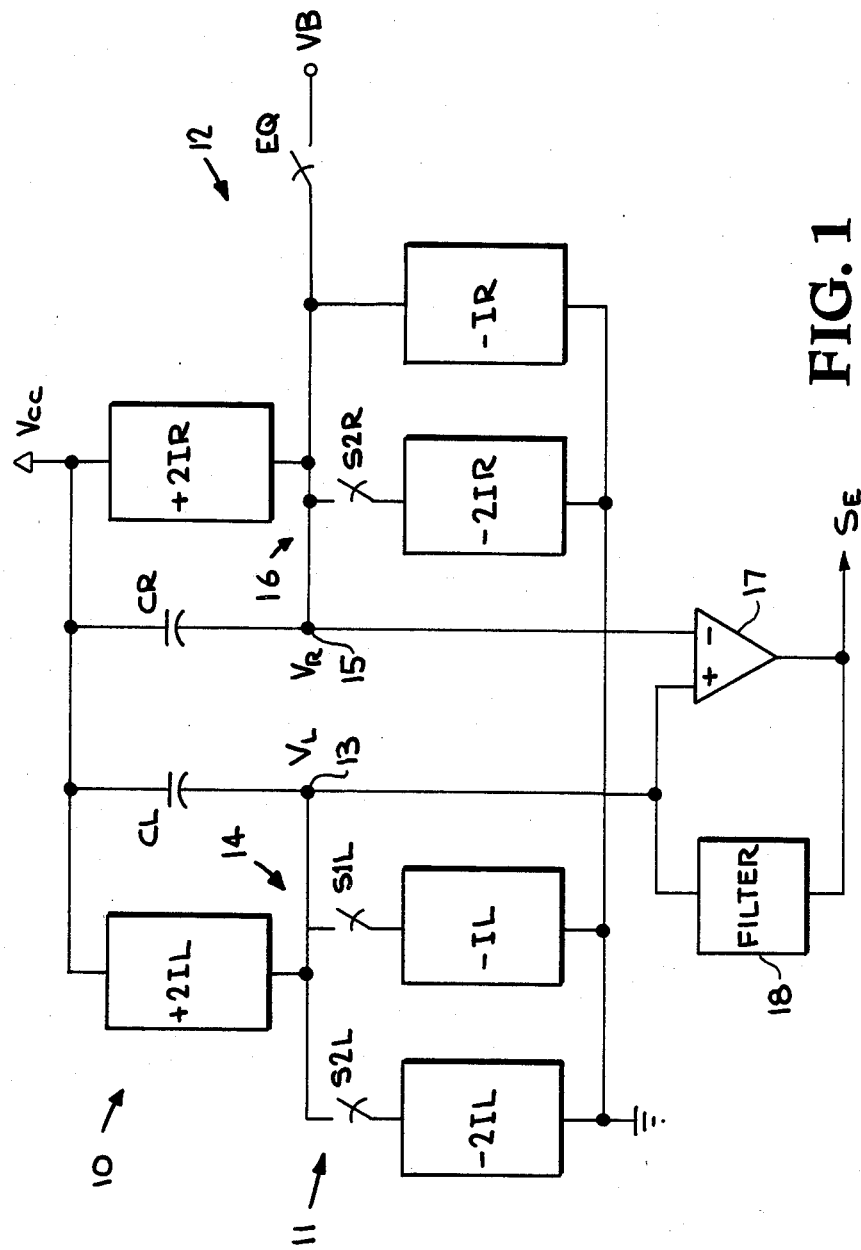
FIG. 1 is a hueristical block diagram of a charge pump apparatus of the present invention.

FIG. 1 shows a hueristical block diagram of a charge pump apparatus 10 according to the present invention. As shown in FIG. 1, the charge pump apparatus 10 includes a first integrating means 11 and a second integrating means 12.

The first integrating means 11 generates a first node voltage $V_L$ at a first node 13 in response to the switching signals S2L and S1L. The first integrating means 11 includes a charge storage means for storing charge, such as capacitor CL, that is connected from the first node 13 to a reference voltage $V_{CC}$. Also, a current source means 14, responsive to the switching signals, for supplying positive current, negative current or substantially no current a the first node 13 to charge up, charge down, or maintain the first node voltage $V_L$ at the first node 13 is included.

The current source means 14 includes a positive current source +2IL for supplying a positive current equal to 2I at the first node 13. Also included, is a negative current source −2IL for supplying a negative current equal to −2I at the node 13 in response to the switching signal S2L. Further, the current source means 14 includes a negative current source −IL for supplying a current equal to −I at the node 13 in response to the switching signal S1L.

The second integrating means 12 includes a charge storage means, such as a capacitor CR, for storing charge connected from a second node 15 to the reference voltage $V_{CC}$. The second integrating means 12 includes a current source means 16, responsive to switching signals, for supplying positive current, negative current or substantially no current at the second node 15 to charge up, charge down or maintain, respectively, the second node voltage $V_R$ at the second node 15.

As shown, the current source means 16 includes a positive current source +2IR for supplying a current equal to 2I at the second node 15. Also, a negative current source −2IR is included for supplying a negative current equal to −2I at the second node 15 in response to the switching signal S2R. In addition, a negative current source −IR is included for supplying a current equal to −I at the second node 15. Further, a bias supply voltage VB is supplied by an equalizing means at the second node 15 in response to the control signal EQ for "equalizing" the second node, or in other words, biasing the second node to a bias level.

The charge pump apparatus 10 includes an output means 17 for generating an output signal $S_E$ which is proportional to the difference between the first node voltage $V_L$ a the first node 13 and the second node voltage $V_R$ at the second node 15 ($V_L$-$V_R$). The output signal $S_E$ is filtered by the filter means 18 connected to the first node 13 and the output signal $S_E$ for varying the first node voltage $V_L$ in response to the difference between the first node voltage $V_L$ and the second node voltage $V_R$.

Figure 2:
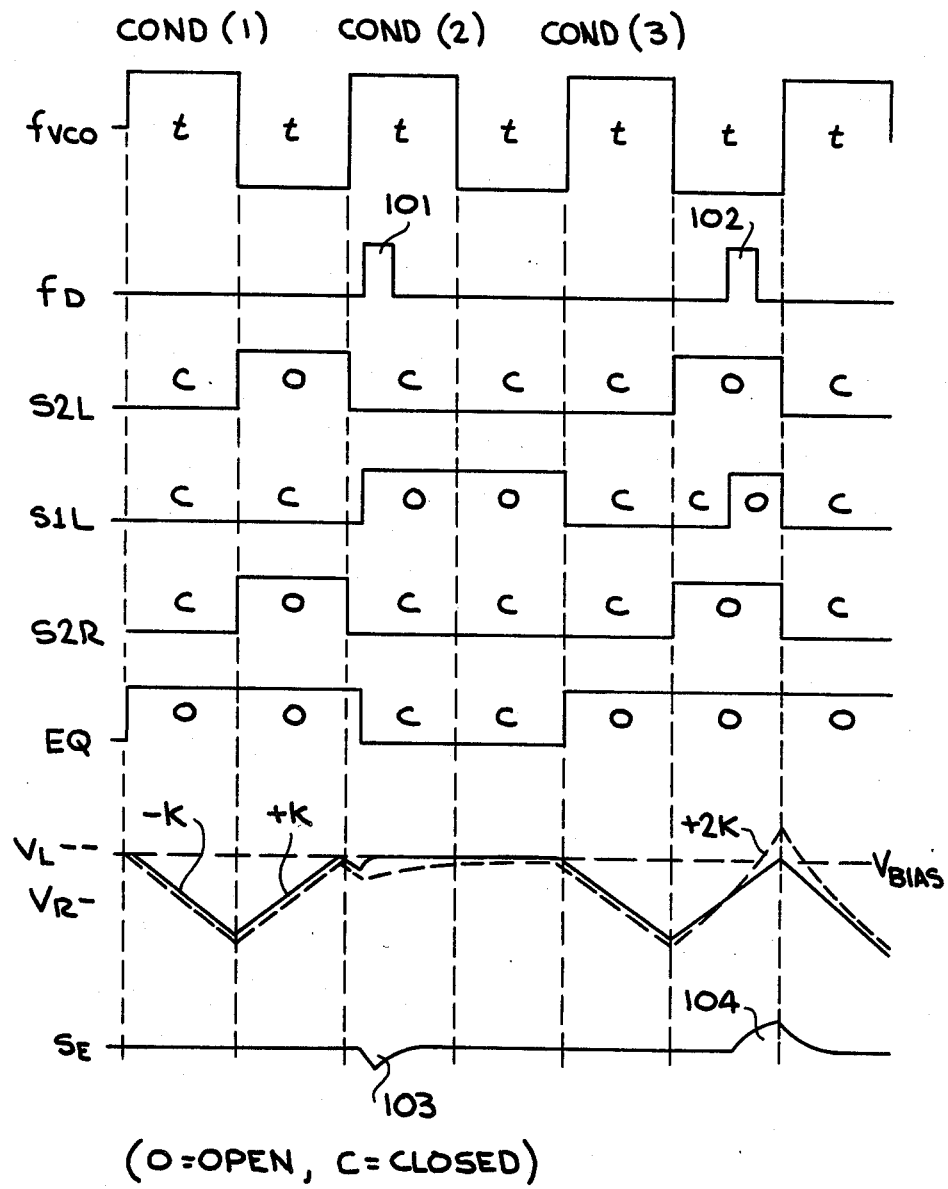
FIG. 2 is a signal diagram illustrating the operation of the charge pump apparatus of the present invention.

The operation of the first integrating means 11 and the second integrating means 12 is best understood with reference to the signal charts shown in FIG. 2. For the embodiment described in FIG. 2, the charge pump apparatus is connected as part of a phase detector for phase-locked loop. The phase-locked loop generates a reference frequency signal $f_{VCO}$ having a stream of frequency pulse signals shown in FIG. 2 as a square wave having a period of 2t, so each half cycle has a length of t, each cycle of the square wave being a frequency pulse signal. The phase-locked loop receives a data signal $f_D$ which consists of a stream of data pulses which may or may not occur during a given period of the reference frequency signal $f_{VCO}$. The switching signals S2L, S1L, S2R and EQ are operative to open and close the switches shown in FIG. 1 to generate an output signal $S_E$ indicating the difference in phase between the data pulse signals and the frequency pulse signals.

The first and second integrating means 11, 12 are controlled to generate an accurate error signal $S_E$ in three conditions. The first condition (1) occurs when no data pulse signal is received during a cycle of the frequency pulse signals; the second condition (2) occurs when a late data pulse is received, that is, a data pulse received during the first half cycle of the frequency pulse signal; and the third condition (3) occurs when an early data pulse is received, that is, a data pulse received during the second half cycle of the frequency pulse signal.

In the first condition (1) the switches S2L, S1L, S2R and EQ are controlled as set out in FIG. 2. That is, S2L is closed, S1L is closed, S2R is closed and EQ is open. As can be seen with reference to FIG. 1, this will result during the first half cycle of the frequency pulse signal $f_{VCO}$ in a net current of negative I being supplied to the first node 13 so that the first node voltage $V_L$ will ramp downward at a constant slope $-K$, determined by the size of the capacitor CL and the magnitude of the current I, for the entire first half cycle of the frequency pulse signal. Likewise, the net current supplied at the second node 15 will be equal to $-I$, so for capacitor CR having the same size as capacitor CL, the second node voltage $V_R$ at the second node 15 will ramp down at the constant slope $-K$ tracking the voltage $V_L$ at the first node 13 during the entire first half cycle of the frequency pulse signal.

During the second half cycle in the first condition (1), switches S2L, S2R and EQ are open while S1L remains closed. This results in a net position current equal to I at the first and second nodes 13, 15 so that the first node voltage $V_L$ at the first node 13 ramps up at the constant slope $+K$ and the second node voltage $V_R$ at the second node 15 ramps up at the equivalent slope $+K$ until the end of the second half cycle of the frequency pulse signal, at which time the voltages, $V_L$ and $V_R$, have returned to the starting level, designated $V_{bias}$.

Accordingly, during the first condition (1) the difference in node voltages ($V_L$-$V_R$) across the first node 13 and the second node 15 of the first and second integrating means 11, 12, respectively, remains zero. This results in an error signal $S_E$ which is flat as shown in the figure.

The second condition (2) occurs when a data pulse signal 101 occurs during the first half cycle of the frequency pulse signal. In this condition, the switches S2L, S1L, S2R and EQ remain in a state as if no frequency pulse signal were occurring during the first half cycle until the leading edge of the data pulse signal 101. At the leading edge, the condition of the switches changes so that S2L is closed, S1L is open, S2R is closed and EQ is closed. This results in an essentially balanced condition occurring at the first node 13 so that no net current is supplied to the first node to charge the first node voltage $V_L$. On the other hand, the second node 15 is switched to $V_{bias}$ by the equalizing means. The switches stay in this state until the end of the cycle as shown in FIG. 2.

In this second condition (2), because the second node voltage $V_R$ is forced to the bias voltage $V_{bias}$ quickly upon the receipt of the data pulse signal 101, while the first node voltage $V_L$ at the first node 13 is essentially maintained at the level it had reached at the time the data pulse signal 101 occurred, a difference in voltage occurs which is reflected in the error signal $S_E$ at 103. Because the error signal $S_E$ is generated, the filter means 18 supplies a small current at the first node 13 so that the first node voltage $V_L$ will slowly track back toward the second node voltage $V_R$.

The third condition (3) occurs when a data pulse signal 102 occurs during the second half cycle of the frequency pulse signal. Because no data pulse signal occurs during the first half cycle in this third condition (3), the switches S2L, S1L and S2R are closed while the switch EQ is open during the first half cycle as shown. This causes the first node voltage $V_L$ and the second node voltage $V_R$ at the first node 13 and second node 15, respectively, to ramp downward at the equivalent slope $-K$ during the first half cycle. At the beginning of the second half cycle, switch S2L is open, switch S1L is closed, switch S2R is open and switch EQ is open resulting in the node voltages $V_L$ and $V_R$ ramping upward at a constant and equivalent slope $+K$ until the occurrence of the data pulse signal 102. On the leading edge of the data pulse signal 102, the switches S2L, S1L, S2R and EQ are all open. This results in the first node voltage $V_L$ ramping upward at twice the slope $+2K$ because a net current equal to 2I is being supplied at the first node 13. The second node voltage $V_R$ at the second node 15 maintains its constant ramp $+K$ because the net current being supplied at the second node 15 is equal to I. This results in a difference in voltage reflected in the error signal $S_E$ at 104. At the end of the second half cycle, the switches S2L, S1L, S2R are all closed and the EQ switch is open. The difference in voltage between the first node 13 and the second node 15 causes the filter means 18 to generate a slight current which results in the first node voltage $V_L$ tracking slowly towards the second node voltage $V_R$ as illustrated.

Thus it can be seen that the second node voltage $V_R$ is always at the level $V_{bias}$ at the beginning and end of each cycle. The first node voltage $V_L$ is not so constrained, but tracks toward the second node voltage $V_R$ due to the filter means 18.

It can be determined that the error signal $S_E$ in the second condition (2) generated at 103 is approximately proportional to the phase error, or time between the leading edge of the frequency pulse signal and the leading edge of the data pulse signal 101. Also, the error signal $S_E$ in the third condition (3) generated at 104 is approximately proportional to the phase error, or the time between the leading edge of the data pulse signal 102 and the leading edge of the following frequency pulse signal.

As can be seen, the charge pump apparatus 10 is adaptable to operate as a phase detector which is operable whether or not a data pulse signal occurs during a given period of the reference frequency signal $f_{VCO}$. Accordingly, it is useful in decoding data stored on magnetic media, such as floppy disks or hard disks, in a variety of encoding schemes, such as MFM encoded data or others.

Data encoded on magnetic storage media is encoded at nominal data rates that vary over a range of frequencies. For instance, for typical hard disk data encoding, the nominal data rate of the data pulse signal $f_D$ may have a frequency anywhere in a range of 4 to 16 MHz. Similarly, for floppy disk type encoded data, the nominal data rate may vary over a range of frequencies from 125 KHz to 1 MHz for both single and double density floppy disks. Thus it is desirable to have a phase detector 10 which is variable over a range of frequencies so that it is suitable to decode data on a variety of magnetic media. According to the present invention, by varying the value of I with constant values of capacitance for CL and CR, the frequency response of the charge pump apparatus 10 is varied. Thus the present invention provides current source means 14, 16 which are scalable over a wide range, so that a wide range of frequency response is obtained.

II. A Phase Detector According to the Present Invention

Figure 3:
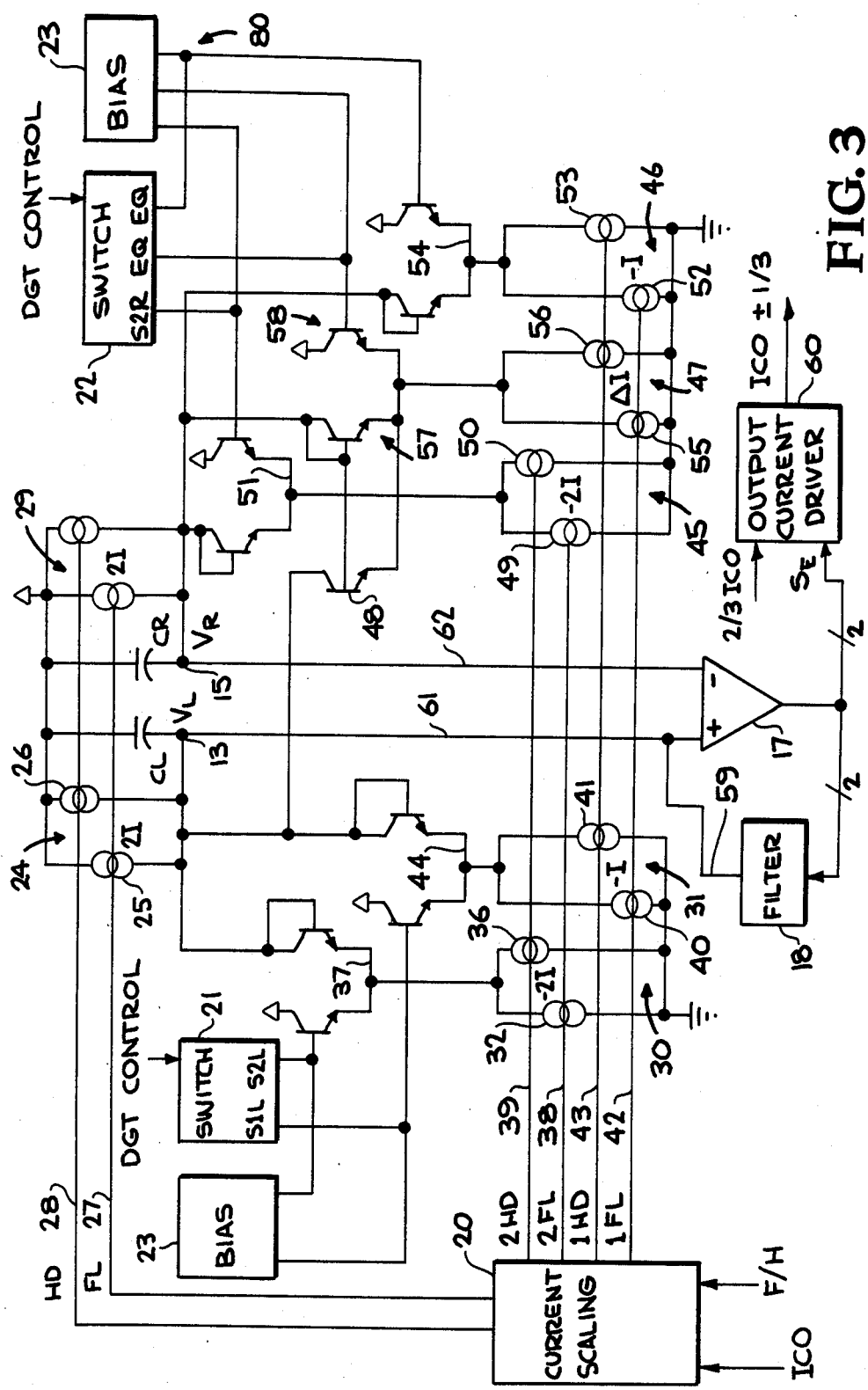
FIG. 3 is a schematic diagram of a phase detector according to the present invention.

FIG. 3 shows a more detailed schematic diagram of the charge pump apparatus 10 of the present invention including current scaling means 20 for varying the current I, switching means 21, 22, responsive to digital control signals, for switching the current sources, and biasing means 23 for setting the bias levels. Furthermore, the circuit in FIG. 3 shows the current sources connected in two banks. One bank supplies higher current, and in conjunction with the other bank, facilitates the operation of the charge pump apparatus in a high frequency range of operation, termed the hard disk mode, and the other bank supplies lower current, and with the one bank, facilitates operation in a low frequency range of operation, termed the floppy disk mode. Because of the two banks, the current source means are shown in pairs as discussed below. For operation in additional frequency ranges, additional banks of current sources can be added.

Accordingly, the first node 13 receives current from the +2I current source 24 consisting of a first variable current source 25 of the first bank and a second variable current source 26 of the second bank. The first variable current source 25 and the second variable current source 26 receive signals over lines 27 and 28, respectively, from the current scaling means 20 for varying the current supplied by each source. When operating in the hard disk mode, both the first variable current source 25 and the second variable current source 26 supply current at the first node 13. However, when operating in the floppy disk mode, the second variable current source 26 is disabled.

Figure 5:
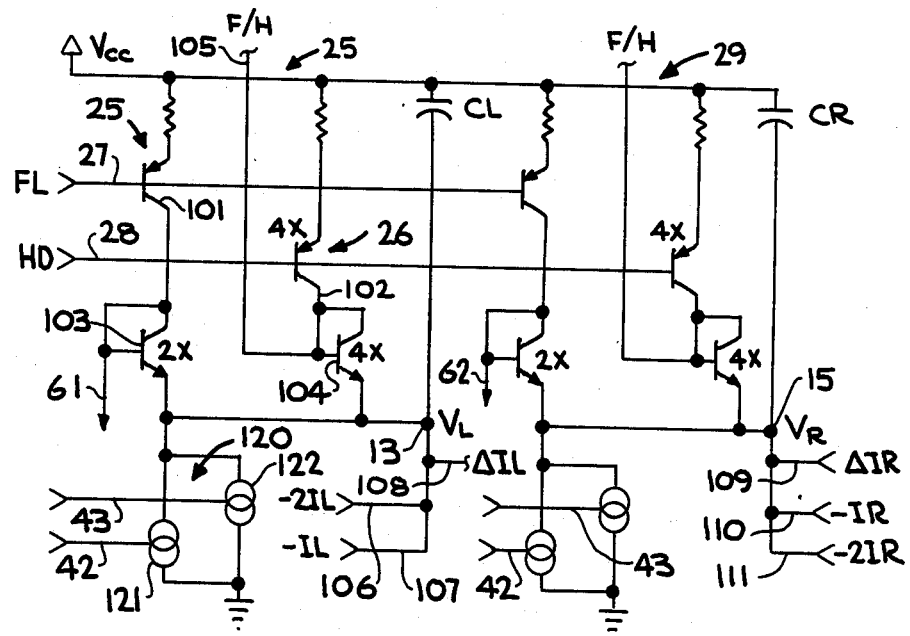
FIG. 5 is a schematic diagram of a phase-locked loop apparatus according to the present invention.

Likewise, the +2I current source 29 for the second node 15 is implemented with identical components. A more detailed schematic of the actual implementation in the preferred embodiment of the positive current sources 24, 29, using positive 4I current sources balanced by negative 2I current sources to accommodate the filter means 18, is shown in FIG. 5.

The −2I current source 30 and the −I current source 31 supplying current to the first node 13, also each consist of a pair of variable current sources. The −2I current source 30, includes a first variable current source 32 of the first bank and a second variable current source 36 of the second bank. The current from the pair of variable current sources 32, 36 is supplied to a current switch 37 responsive to the switching signal S2L. The first variable current source 32 of the −2I current source 30 receives a signal on line 38 from the current scaling means 20 for varying the current supplied. Likewise, the second variable current source 36 of the −2I current source 30 receives a signal on line 39 from the current scaling means 20 for varying the current supplied. In the hard disk or high frequency mode, both variable current sources 32, 36 are enabled supplying current to the switch 37. However, in the floppy disk or low frequency mode, the second variable current source 36 is disabled.

Figure 6:
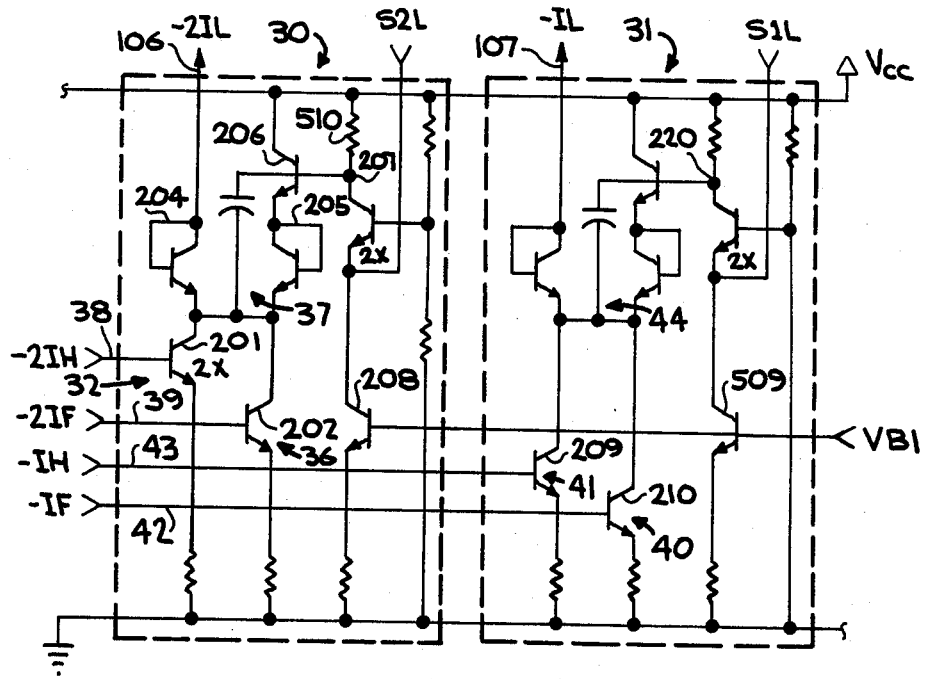

The −I current source 31 supplying current to the first node 13 consists of a first variable current source 40 of the first bank and a second variable current source 41 of the second bank. The first variable current source 40 is responsive to a signal on line 42 from the current scaling means 20 for varying the current supplied; and the second variable current source 41 is responsive to a signal on line 43 from the current scaling means 20 for varying the current supplied. In the hard disk mode, both current sources 40, 41 are operable, while in floppy disk mode, the second variable current source 41 is disabled. The current is supplied to a current switch 44 which is operable in response to the signal S1L from the switching means 21. A more detailed circuit diagram of the preferred implementation of the negative current sources 30, 31 supplying the first node 13 is shown in FIG. 6.

The negative current sources feeding the second node 15 consist of a −2I current source 45, −I current source 46 and a delta I current source 47. The delta I current source 47 also feeds the first node 13 through transistor 48 as will be described below.

Each of the negative current sources 45, 46, 47 feeding the second node 15 include a pair of variable current sources operable to provide a high frequency, or hard disk, mode of operation and a low frequency, or floppy disk, mode of operation. The −2I current source 45 includes a first variable current source 49 of the first bank and a second variable current source 50 of the second bank. The first variable current source 49 receives a signal across line 38 from the current scaling means for varying the current supplied. Likewise, the second variable current source 50 receives a signal across line 39 from the current scaling means for varying the current supplied. In the high frequency, or hard disk, mode of operation, both variable current sources 49, 50 are operable. In the floppy disk mode or low frequency range of operation, the second variable current source 50 is disabled. The current supplied from the first variable current source 49 and the second variable current source 50 is switched by the current switch 51 which is responsive to the signal S2R from the switching means 22.

The −I current source 46 feeding the second node 15 includes a first variable current source 52 of the first bank and a second variable current source 53 of the second bank. The first variable current source 52 receives a signal across line 42 from the current scaling means 20 for varying the current supplied. The second variable current source 53 receives a signal across line 43 from the current scaling means 20 for varying the current supplied. In the hard disk mode of operation, both variable current sources 52, 53 are operable; while in the floppy disk mode of operation the second variable current source 53 is disabled. The −I current supplied by the current source 46 is switched at the second node 15 through the current switch 54 and is responsive to the signal EQ from the switching means 22.

The biasing means 23 supplies a bias voltage at the current switches 37, 44, 51, 54, 57 for controlling the respective current sources 45. The bias means 23 sets the level $V_{bias}$ for the second node 15. The operation of the bias means 23 and its effect on the current switches 37, 44, 51, 54, 57 is explained in more detail with reference to FIG. 7. The bias means 23 and the switches 51, 54 are termed equalizing means 80 for setting the second node voltage $V_R$ to a bias level.

The delta I current source 47 also includes a first variable current source 55 of the first bank and a second variable current source 56 of the second bank. The first variable current source 55 and the second variable current source 56 receive signals across lines 42, 43, respectively, from the current scaling means 20 for controlling the scale of the current supplied. The current supplied by the delta I current source 47 is a relatively small current and feeds both the first node 13 through the transistor 48 and the second node 15 through transistor 57 in response to the switching signal EQ from the switching means 22 across current switch 58. The delta I current is supplied at the first node 13 and the second node 15 to control drift as explained below.

The voltage $V_L$ at the first node 13 and the voltage $V_R$ at the second node 15 are supplied to the output means 17 across lines 61 and 62, respectively.

The output signal $S_E$ is generated in the output means 17. The filter means 18 in this embodiment is implemented using an electronic filter means such as disclosed in my prior U.S. patent application entitled "CONTROLLABLE EFFECTIVE RESISTANCE AND APPLICATIONS OF SAME", filed Dec. 17, 1984, Ser. No. 682,381, owned at the time of invention and currently by a common assignee, which is incorporated by reference as if fully set forth herein. As mentioned above, the filter means 18 supplies a current at the first node 13 which is proportional to the difference in voltage ($V_L$-$V_R$) between the first node 13 and the second node 15. The filter means as disclosed in the prior application delivers a current in a high frequency range and a low frequency range on line 59 which is scaled according to current scaling signals across lines 38, 39 from the current scaling means 20 so that the frequency response of the charge pump apparatus 10 matches the frequency response of the filter means 18.

In the preferred embodiment, the output signal $S_E$ is supplied as a differential voltage to an output current driver 60 which supplies an output $I_{OUT}$. The signal ICO is a current indicating the nominal data rate of the data stream $f_D$ or other signal being received by the phase detector. The error signal $S_E$ is operable to vary the signal $I_{OUT}$ over a range equal to ICO±⅓ ICO. The circuit of the output current driver 60 is described with reference to FIG. 13.

III. Phase-Locked Loop Apparatus According to the Present Invention

Figure 4:
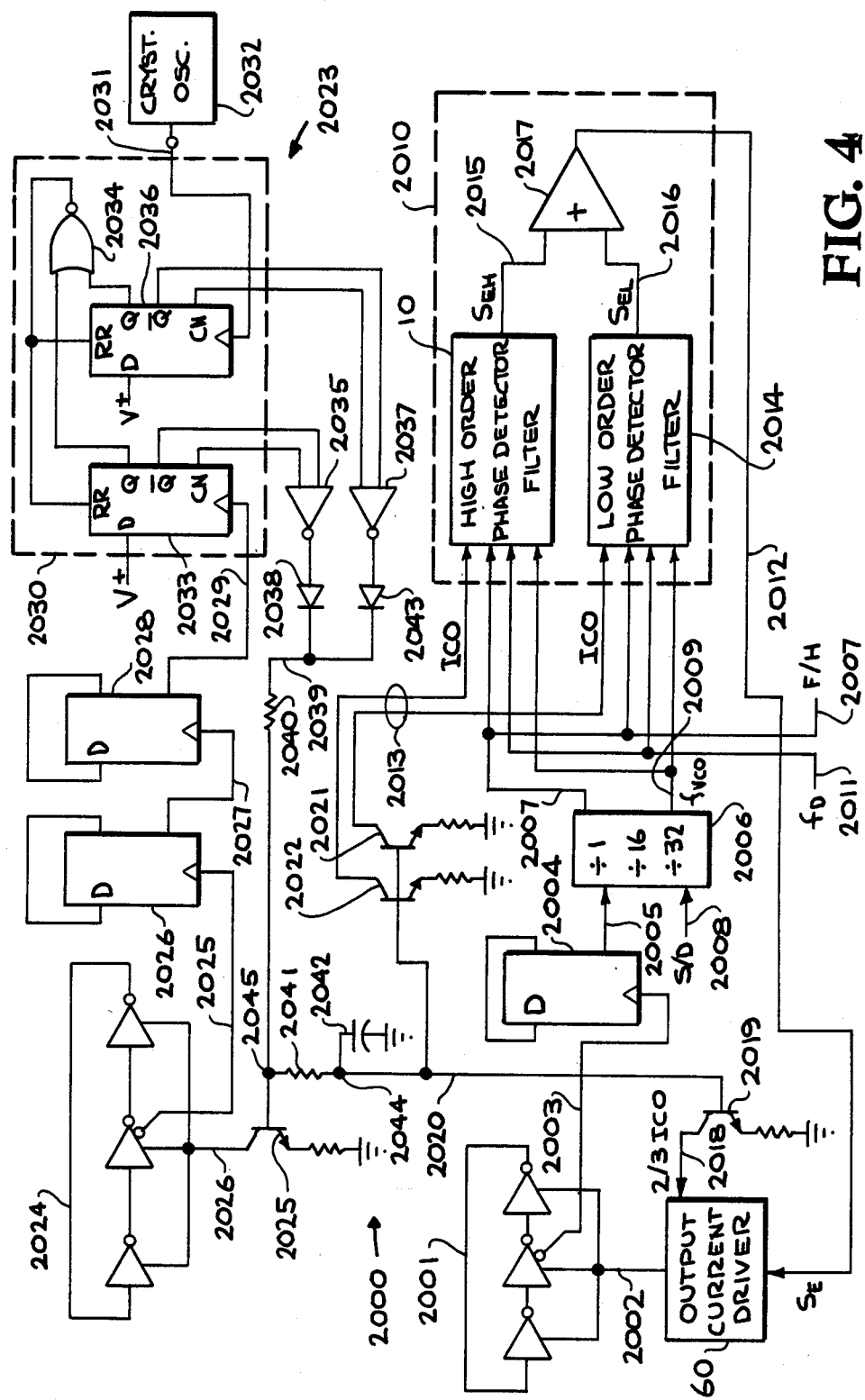

FIG. 4 is a schematic diagram of a phase-locked loop apparatus according to the present invention for generating a frequency signal $f_{VCO}$ that is in phase with a data signal $f_D$ for a range of data rates of data stored on magnetic media, particularly hard disks and floppy disks having either single or double density formats.

The phase-locked loop apparatus 2000 includes a first controllable oscillator 2001, responsive to a control signal on line 2002, for generating the frequency signal $f_{VCO}$. In the embodiment shown in FIG. 4, the output from the controllable oscillator 2001 generated on line 2003 preferably has a frequency in the range of 16 to 64 megaHertz. This signal on line 2003 is supplied to a flip-flop 2004 which operates as a means for dividing the signal on line 2003 by 2. Thus the output on line 2005 from the flip-flop 2004 is a frequency signal in the range of 8 to 32 megaHertz and suitable for operation in the hard disk mode. The signal on line 2005 is supplied to a dividing means 2006 which divides the signal on line 2005 by an integer in response to the floppy/hard signal F/H and the single density/double density signal S/D. Thus the dividing means 2006 divides the signal on line 2005 by one in the hard disk mode as indicated by the floppy/hard signal on line 2007. In the floppy disk mode, the floppy disk may either be a single or double density disk. Thus the dividing means 2006 divides the signal on line 2005 by 16 in the double density mode as indicated by the single density/double density signal S/D on line 2008 or by 32 in the single density mode. The output on line 2009 of the dividing means 2006 is the frequency signal $f_{VCO}$ having a frequency of twice the data rate.

A detailed implementation of the controllable oscillator 2001 can be found in prior U.S. patent application entitled "AN INTERRUPTABLE VOLTAGE-CONTROLLED OSCILLATOR", invented by David L. Campbell, filed Aug. 5, 1983, Ser. No. 520,876, now U.S. Pat. No. 4,565,976, and owned at the time of invention and currently by an assignee in common with the present application. This application entitled "AN INTERRUPTABLE VOLTAGE-CONTROLLED OSCILLATOR" is incorporated by reference as if fully set forth herein.

The phase-locked loop apparatus 2000 further includes a first phase detector means 2010, responsive to a data signal $f_D$ on line 2011 and the frequency signal $f_{VCO}$ on line 2009, that has a frequency response in dependence on the nominal data rate of the data signal $f_D$. The first phase detector means generates an error signal $S_E$ on line 2012 indicating the difference in phase between the data signal $f_D$ and the frequency signal $f_{VCO}$. The first phase detector means 2010 includes a means for varying the frequency response of the first phase detector means 2010 over the entire range of frequency for the hard disk and floppy disk modes of operation. As explained with reference to the phase detector apparatus 10 of the present invention, the frequency response of the phase detector means 2010 varies in response to a reference signal ICO generated on lines 2013.

The phase detector apparatus 10 of the present invention as explained with reference to FIG. 3 is utilized as a high order phase detector filter.

The first phase detector means 2010 of the phase-locked loop apparatus 2000 also includes a low order phase detector filter 2014 such as that described in my application entitled "LOW ORDER CHARGE-PUMP FILTER", invented by Neil R. Adams, filed in conjunction herewith and owned at the time of invention and currently by an assignee in common with the present invention. The "LOW ORDER CHARGE-PUMP FILTER" application is incorporated by reference as if fully set forth herein.

The high order phase detector filter 10 generates a high order error signal $S_{EH}$ on line 2015 and the low order phase detector filter 2014 generates an error signal $S_{EL}$ on line 2016 which are summed in the summing means 2017 to generate the error signal $S_E$ on line 2012. The error signal $S_E$ on line 2012 is supplied to the output current driver 60 such as that shown in FIG. 3 and described in detail with reference to FIG. 13. The output current driver 60 receives a signal equal to ⅔ ICO on line 2018 from the current source transistor 2019. The base drive of the current source transistor 2019 is supplied on line 2020. The signal on line 2020 likewise drives the current source transistors 2021, 2022 which supply the reference signal ICO on lines 2013.

The phase-locked loop apparatus 2000 shown in FIG. 4 also includes a reference means 2023 for generating the signal on line 2020 for driving the reference signal transistors 2019, 2021, 2022. The reference signal on line 2020 indicates the nominal data rate of the data signal $f_D$.

The reference means 2023 for generating the reference signal comprises a reference phase-locked loop circuit. The reference means 2023 includes a second controllable oscillator 2024 made up of components substantially identical to the first controllable oscillator 2001. It is driven by a current source transistor 2025 whose current output on line 2026 depends on the nominal data rate.

The second controllable oscillator 2024 generates an output signal on line 2025 having a frequency in the range of 16 to 64 megaHertz for the floppy disk and hard disk embodiment being discussed. The signal on line 2025 is supplied to a flip-flop 2026 which generates an output signal on line 2027 having ½ the frequency of the signal on line 2025. Likewise the signal on line 2027 is supplied to a flip-flop 2028 which generates a signal on line 2029 equal to ¼ the signal on line 2025. Thus the signal on line 2029 is within the range of 4 to 16 megaHertz. The signal on line 2029 is supplied to a digital phase detector 2030. Also supplied to the digital phase detector 2030 is a signal on line 2031 indicating the nominal data rate of the data signal $f_D$ for the data stored on a particular floppy or hard disk being utilized at a given time. The signal on line 2031 is generated by an oscillator means 2032, such as a crystal oscillator selected to match the nominal data rate of a particular data signal to be read.

The digital phase detector 2030 includes a first flip-flop 2033 with its Q output connected to NOR-gate 2034 and its $\overline{Q}$ output connected to a driver 2035. A common output CM is also supplied to the driver 2035 for reference. The first flip-flop 2033 is clocked by the signal on line 2029.

The digital phase detector also includes a second flip-flop 2036 with its Q output connected to the NOR-gate 2034, its $\overline{Q}$ output connected to a driver 2037 and a common output CM also connected to the driver 2037. The second flip-flop 2036 is clocked by the signal on line 2031 from the crystal oscillator 2032.

When the signal on line 2029 clocks the first flip-flop 2033 before the signal on line 2031 clocks the second flip-flop 2036, a pump-down pulse is generated through the diode 2038 to line 2039 across resistors 2040 and 2041 to a filter capacitor 2042.

Likewise when the second flip-flop 2036 is clocked before flip-flop 2033, a charge-up pulse is generated through diode 2043 to line 2039.

Thus the voltage at node 2044 and at node 2045 at any given time is set in dependence on the nominal data rate as indicated by the signal on line 2031. In this manner, the signal ICO on lines 2013 and the signal ⅔ ICO on line 2018 are set to values depending on the nominal data rate.

Of course, the crystal oscillator 2032 is selected by the user to correspond to the particular data storage media being utilized or other source of the data signal $f_D$.

Accordingly, a user can adapt a single phase-locked loop apparatus 2000, such as shown in FIG. 4, to operate over a wide range of data frequencies. To select a data frequency, the user selects a crystal oscillator 2032 or other oscillator for generating a signal on line 2031 indicating the nominal data rate of the data signal $f_D$ generated by the particular storage media being used and the sets the floppy/hard signal F/H and the single density/double density signal S/D on lines 2007 and 2008, respectively. The phase-locked loop apparatus 2000 then automatically locks onto the data signal $f_D$ and generates the reference frequency signal $f_{VCO}$.

IV. Detail Circuit Description

IV.A. Variable Current Sources and Current Switches.

FIG. 5 shows the +2I current sources for both the first node 13 and the second node 15. The +2I current source 24 for the first node 13 consists of a first variable current source 25 implemented as a current mirror transistor 101. The second variable current source 26 is likewise implemented as a current mirror transistor 102. The signals across lines 27 and 28 vary the current supplied through the current mirrors 101, 102 to match the frequency of the data stream as explained with regard to the current scaling means 20 in FIG. 8. The current supplied by the first current mirror 101 is scaled to be 1/16th the current supplied by the second current mirror 102. The diode-connected transistor 103 sets a biasing level for the output means 17 and supplies the first node voltage $V_L$ across line 61 from its base. The diode-connected transistor 104 is connected to allow for reverse biasing to clamp off the current mirror transistor 102 in the floppy disk mode. As mentioned above, the second variable current source 26 is disabled when operating in the floppy disk mode. This is accomplished in part across line 28 by the current scaling means 20. However, because the positive current sources are often difficult to turn off, a floppy/hard clamp signal F/H is supplied across line 105 for clamping the second variable current source 26 off. The floppy/hard clamp circuit is explained with reference to FIG. 10.

As shown in FIG. 5, the current mirror transistors 101 and 102 are scaled to provide a current equal to +4I and balanced by a −2I current sources 120, resulting in a net +2I current at the first node 13. The −2I current sources 120 include a first variable current source 121 which is scaled according to a current scaling signal across line 42 from the current scaling means 20; and a second variable current source 122 which is scaled according to a current scaling signal across line 43 from the current scaling means 20.

The +2I current source 29 supplying the second node 15 matches as exactly as possible with the +2I current source 25 supplying the first node 13. So the above description of the current source 25 applies as well to the current source 29. The voltage $V_R$ is supplied across line 62.

The value of the capacitor CL for the first node 13 is 30 picoFarads; likewise the value of the capacitor CR for the second node 15 is 30 picoFarads in this preferred embodiment.

The first node 13 receives current −2IL and −IL from the negative current sources 30 and 31 across lines 106, 107, respectively.

Likewise, the delta IL signal is received across line 108 at the first node 13.

The second node 15 receives the currents delta IR, −IR and −2IR across lines 109, 110, and 111, respectively.

The negative current sources 30, 31 feeding the first node 13 are shown in FIG. 6. The −2I current source 30 comprises the first variable current source 32 including a first current mirror transistor 201 and the second variable current source 36 including a second current mirror transistor 202 which are varied according to the current scaling signals across lines 38 and 39, respectively, from the current scaling means 20. The current switch 37 operates in response to the switching signal S2L to deliver the current −2I on line 106. The current switch 37 comprises a first diode-connected transistor 204 and a second diode-connected transistor 205 having their emitters coupled. A switching transistor 206 is switched at the node 207 by a voltage swing equal to two ECL logic voltage swings, $2V_L$, or about 1.5 volts. A current is supplied across the line S2L causing the voltage swings at the node 207 as desired. A bias level at node 207 is established to equal about $V_{CC}/2+V_{BE}+V_L$ according to the collector current of transistor 208 set by the bias signal VB1, when the current from line S2L is off in order to set symmetrical switching characteristics. When S2L is on, the level at node 207 equals about $V_{CC}/2+V_{BE}-V_L$.

The −I current source 31 comprises a current mirror transistor 209 corresponding to variable current source 41 and a current mirror transistor 210 corresponding to variable current source 40 for supplying current −I to the first node 13 through current switch 44. The current switch 44 is identical to the current switch 37 but responsive to the signal S1L. Thus, the description of the current switch 37 applies as well to the switching means 44.

Figure 7:
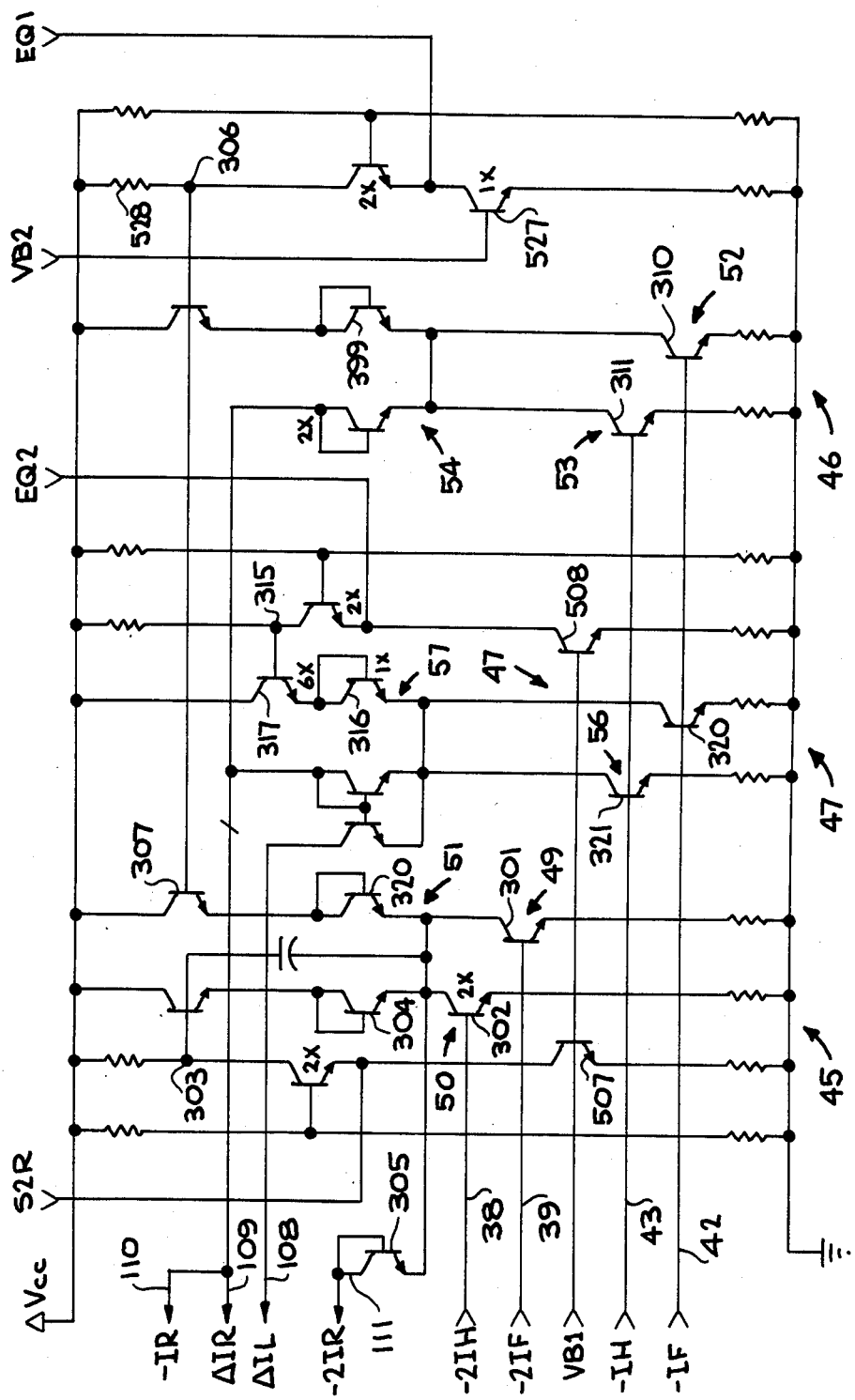

The −2I current source 45, and the −I current source 46 supplying current to the second node 15 and the delta I current source 47 are shown in more detail in FIG. 7. The −2I current source 45 is operable in three modes. In the first mode, substantially zero current is supplied across line 111 to the second node. In the second or equalize mode, the current supplied over line 111 is operable in conjunction with the current supplied by the −I current source 46 in the equalize mode to charge the second node 15 to the bias level $V_{bias}$. In the third mode, the −2I current source 45 supplies −2I current across line 111 to the second node 15.

The −2I current source includes first variable current source 49 implemented as a current mirror transistor 301 receiving a current scaling signal across line 38 from the current scaling means 20 for varying the current supplied to the current switch 51. The second variable current source 50 is implemented with the current mirror transistor 302 receiving a current scaling signal on line 39 from the current scaling means 20 for varying the current supplied to the current switch 51.

The current switch 51 as mentioned above is operable to switch the current on line 111 in three modes in response to the switching signals S2R and EQ1. The signal S2R is a current operable to swing the voltage at note 303 two ECL logic swings $2V_L$, or 1.5 volts, in order to turn on or turn off the current on line 111 through the diode-connected transistors 304, 305 connected with their emitters coupled. The EQ1 signal is a current operable to cause a voltage swing from $V_{CC}/2+V_{BE}-V_L$ to $V_{CC}/2+V_{BE}$ at the node 306. Thus in the equalize mode, the current supplied across EQ1 is turned off and the voltage at the base of transistor 307 is drawn up to $V_{CC}/2+V_{BE}$ and the signal S2R is off. This causes the voltage at the base of transistors 320 and 399 to $V_{CC}/2$. So, in the equalize mode, current is supplied through lines 111 and 110 driving the second node voltage $V_R$ at the second node 15 to the bias level $V_{CC}/2$, designated $V_{bias}$, to establish the balance condition in which the voltage at the base of transistor 305 equals the voltage at the bases of transistors 320 and 399.

The −I switch 46 includes first variable current source 52 and a second variable current source 53. The first variable current source is implemented with current mirror transistor 310 receiving a current scaling signal across line 42 from the current scaling means 20 for varying the current supplied. The second variable current source 53 is implemented with current mirror transistor 311 receiving a current scaling signal across line 43 from the current scaling means 20 for varying the current supplied. The switching means 54 is operable in response to the signal EQ1 to supply a current across line 110 to the second node 15 at a value of −I when the second node 15 is at a level below $V_{bias}$. As the voltage at the second node 15 approaches $V_{bias}$ in the equalize mode, the current switch 51 of the −2I current source 45 and the current switch 54 of the −I current source 46 establish a balanced condition with the +2I current source 29 when the second node voltage $V_R$ equals $V_{bias}$. The signal VB2 from the biasing means 23 sets the level of $V_{bias}$ as explained above with reference to current switch 51. The biasing means 23 is described with reference to FIG. 9.

The delta I current source 47 operates to inject a controlled amount of current, delta I, across lines 108 and 190 into the first node 13 and the second node 15. The amount of current injected is dependent on the difference between the second node voltage $V_R$ at the second node 15 and $V_{bias}$. The level $V_{bias}$ is set by the signal VB1 from the bias means 23 at the base of the transistor 508. Due to collector current through transistor 508, the voltage at node 315 equals $V_{CC}/2+V_{BE}$ when current is supplied through EQ2. The voltage at the base of transistor 316 swings to $V_{CC}/2$ plus a small offset. The small offset is cuased because transistor 317 is a 6X transistor, that is having six times the emitter area of a standard 1X transistor; so the emitter base voltage at transistor 317 is less than standard $V_{BE}$.

The delta I current source 47 is switched out during the equalize mode by turning off the current EQ2 to raise the voltage at the node 315 and thereby cut off the current supplied across lines 108 and 109.

The delta I ourrent source includes a first variable current source 55 implemented with current mirror 320 which receives a current scaling signal across line 42 from the current scaling means 20 for varying the current supplied. Likewise, a second variable current source 56 is included in the delta I current source 47 implemented with current mirror 321 receiving a current scaling signal across line 43 from the current scaling means 20 for varying the current supplied.

IV.B. Current Scaling.

Figure 8:
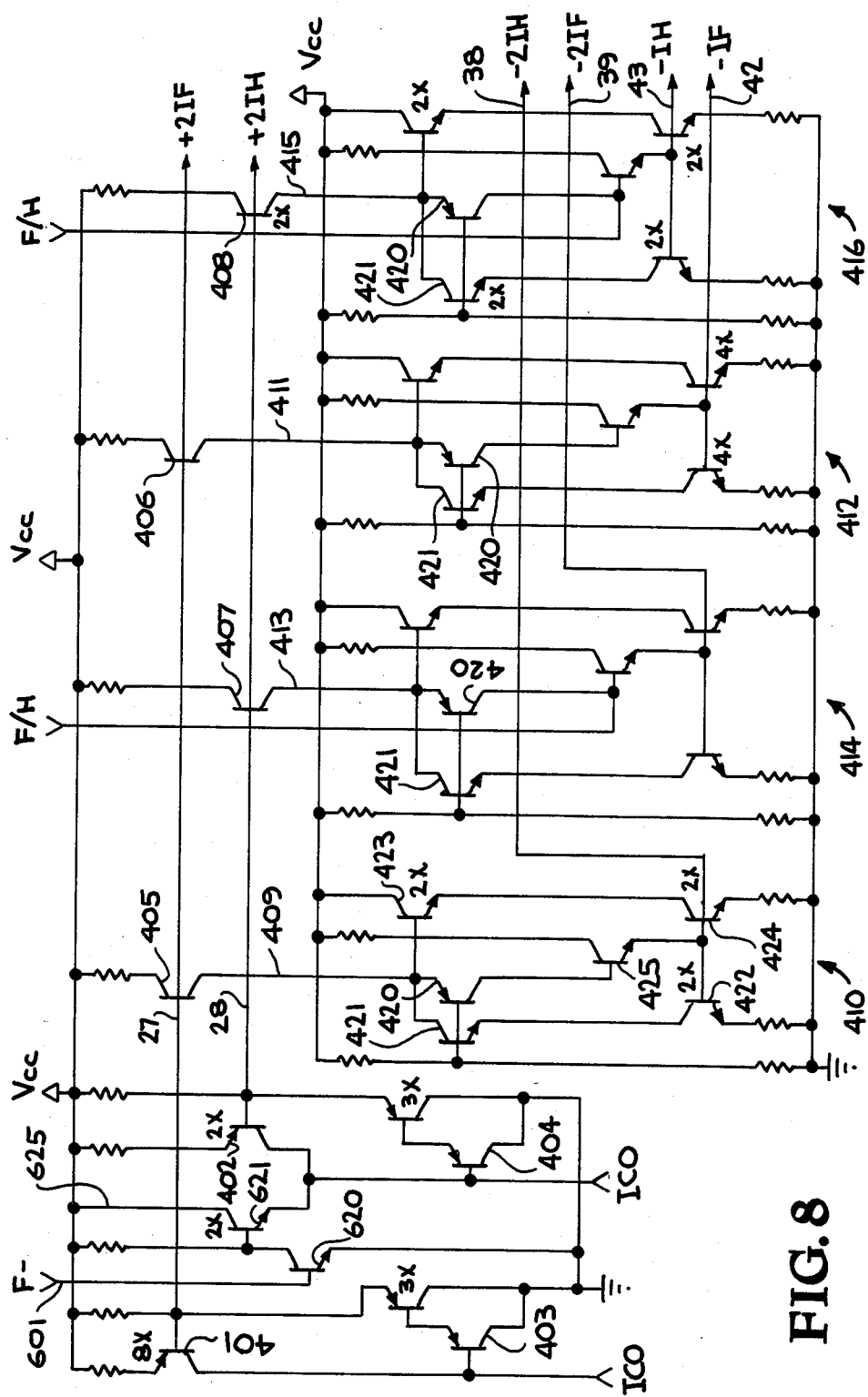

The current scaling means is shown in FIG. 8. As mentioned above, the apparatus is operable in a high frequency range, or hard disk mode, and a low frequency range, or floppy disk, mode. Thus, the current scaling means 20 includes two banks of current mirrors for driving the two banks of variable current sources described with reference to FIGS. 5, 6 and 7. The current sources are varied according to the signal ICO which is a current that is proportional to the desired frequency of operation, such as the nominal frequency of the data stream $f_D$. The designations 8X, 3X, 2X and so on, in FIGS. 5 through 8 indicate the relative emitter areas of the transistors so designated. This area is utilized in the scaling of the current mirrors.

The current scaling means 20 receives the signal ICO at the collector of a first PNP 8X transistor 401 and at the collector of a second PNP 2X transistor 402. The first PNP transistor 401 supplies a mirror voltage at its base for driving the first bank of current mirrors for the low frequency range of operation across line 27. The second PNP transistor 402 supplies a voltage at its base for driving the second bank of current sources for the high frequency range of operation across line 28. The transistor pair 403 supplies base current for the transistor 401. Likewise, the transistor pair 404 supplies base current for the transistor 402.

It can be seen that the current through transistors 401, 402 equals the value of ICO that is proportional to the desired frequency of operation. By using current mirrors of the transistors 401, 402 as the variable current sources in the charge pump apparatus 10, the apparatus is able to vary the reference current I in accordance with the frequency of operation.

The signals across lines 27, 28 are supplied directly as current scaling signals to the positive current sources shown in FIG. 5.

The signals across lines 27 and 28 are likewise supplied to positive current sources 405 and 406 in the first bank and 407 and 408 in the second bank of current mirrors. The first current source 405 is a current mirror of transistor 401, having $\frac{1}{8}$th the area and 8 times the emitter resistor, so that the current across line 409 is $\frac{1}{8}$th the current ICO. The current over line 409 is supplied to the $-2I$ current mirror 410 for the $-2I$ current sources in the first bank, or low frequency bank, of variable current sources. The current mirror 410 generates the current scaling signal across line 38 for driving the negative current sources shown in FIGS. 6 and 7.

The current source 406 likewise mirrors the current through transistor 401 and supplies $\frac{1}{8}$th ICO across line 411 to the current mirror 412 for supplying current scaling signals across line 42 for the $-I$ current sources of the first bank.

The current source 407 mirrors the transistor 402 and has half the area and twice the emitter resistor so that the current supplied across line 413 is equal to $\frac{1}{2}$ ICO. The current supplied across line 413 supplies the current mirror 414 which supplies the current scaling signal across line 39 for driving the $-2I$ current sources for the second bank of variable current sources shown in FIGS. 6 and 7.

The current source 408 mirrors the transistor 402 and has the same size emitter resistor and area so that the current supplied across line 415 is equal to ICO. The current across line 415 feeds the current mirror 416 for supplying the current scaling signal across line 41 for the $-I$ current sources in the second bank, or high frequency bank, of negative current sources shown in FIGS. 6 and 7.

The current mirrors 410, 412, 414, 416 must match the PNP current sources 405, 406, 407, 408, respectively. This is a problem because of the output impedances of the NPN and PNP transistors. This can be accomplished by placing a cascode transistor on the output of each current source. However, in the integrated circuit environment, the lack of reference voltage headroom in the circuit makes this impractical. Thus a new type current mirror using a cascode transistors 420, 421 on the input to the current mirrors is provided. So, the current supplied over line 409 flows through transistor 421 to the current mirror transistor 422. The base current leakage added through transistor 421 is subtracted out by transistor 423. The feedback path from the base of transistor 425 to the collector of transistor 422 is now accomplished through cascode transistors 420 and 421.

The current mirror 410 generating the current scaling signal on line 38 is implemented with 2X transistors. On the other hand, the current mirror transistors 202, 301 receiving the current scaling across line 38 are 1X transistors. This results in a divided by 2 operation so that the current supplied from the collector of transistor 202 and from the collector of transistor 301 is equal to $\frac{1}{2}$ of the current over line 409 of the current scaling means 20 or 1/16 ICO.

The current mirror 414 generating the current scaling signal across line 39 is implemented with 1X transistors. As can be seen in FIGS. 6 and 7, the transistor 201 and transistor 302 receiving current scaling signal across line 39 are implemented with 2X transistors. This results in the current flowing through the collector of transistors 201 and 302 which is two times the current across line 413 or ICO.

The current mirror 412 generating the current scaling signal across line 42 is implemented with 4X transistors. On the other hand, as can be seen in FIGS. 6 and 7, the transistor 210 of FIG. 6 and the transistors 320 and 310 of FIG. 7 are implemented with 1X transistors. This results in a current flowing through the collector of transistors 210, 320 and 310 which is equal to $\frac{1}{4}$ the current flowing across the line 411 or 1/32 ICO.

The current mirror 416 generating the current scaling signal across line 43 is implemented with 2X transistors. The transistor 321 and transistor 311 of FIG. 7 and transistor 209 of FIG. 6 receiving the current scaling signal across line 43 are all implemented with 1X transistors. This results in a current flowing through the collector of transistors 209, 311 and 321 which is equal to $\frac{1}{2}$ the current flowing across line 415 or $\frac{1}{2}$ ICO.

IV.C. Biasing.

Figure 9:
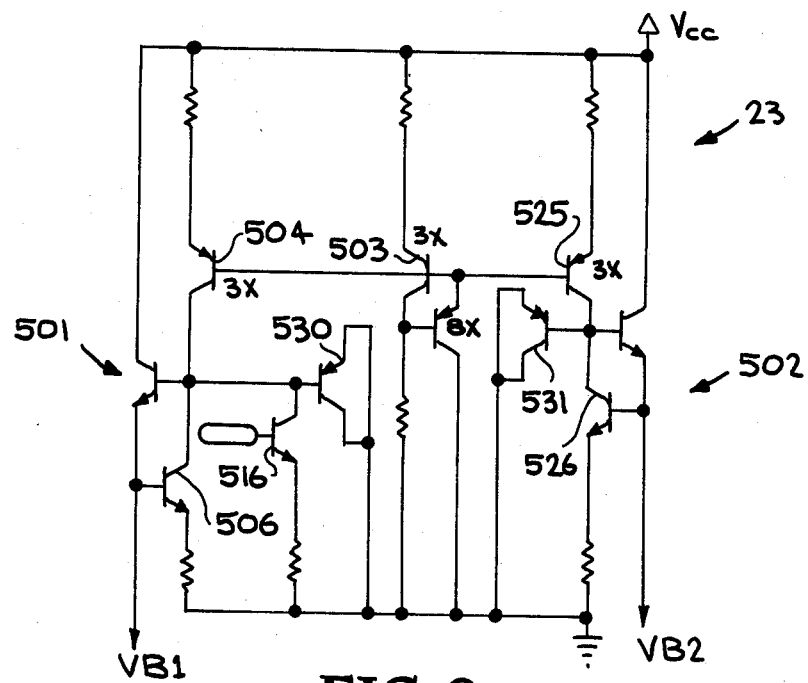

FIG. 9 shows the biasing means 23. Biasing means 23 includes a first current mirror 501 and a second current mirror 502. The first current mirror 501 supplies the bias level VB1 which sets the voltage at the nodes 303, 315 in FIG. 7 and nodes 207 and 220 in FIG. 6 at the level $V_{CC}/2 + V_{BE} + V_L$. As mentioned above, the switching currents S2L, S1L, S2R and EQ2 operate to lower the voltage level at the various nodes 207, 220, 303, 315 in order to switch the current switches 37, 44, 51 and 57. Thus the bias means 23 is controlled to set the bias level $V_{bias}$ approximately equal to $V_{CC}/2$ for optimum positive and negative headroom at the first node 13 and the second node 15. The biasing means 23 operates by establishing a current through 3X transistor 503 equal to $(V_{CC} - 2V_{BE})/5K$. This current is mirrored through transistor 504. An ECL current source 516 draws current from the collector of transistor 504, leaving the current flowing through transistor 506 equal to the current through transistor 503 minus $I_{CS}$. The value of $I_{CS}$ is defined as that amount of current which causes an ECL load, or 2.49K resistor, to swing one logic swing $V_L$, or about 0.75 V.

The current through transistor 506 is mirrored in transistor 507 and 508 of FIG. 7 for the $-2I$ current source 45 and the delta I current source 47, respectively. Also, the current through transistor 506 is mirrored through the transistor 208 and the transistor 509 of the $-2I$ current source 30 and the $-I$ current source 31, respectively, of FIG. 6.

Referring to FIG. 6 for example, the current flowing through the collector of transistor 208 will be equal to the current flowing through transistor 503 of the biasing means 23 minus $I_{CS}$. Since the resistor 510 above the node 207 has resistance R equal to one-half the resistance 2R defining the current through the transistor 503 and since the voltage shift across resistor 503 due to the subtraction of $I_{CS}$ equals $V_L$, the voltage across the resistor 510 will be equal to $(V_{CC}-2V_{BE})R)/2R-V_L$, or $V_{CC}/2-V_{BE}-V_L$. This means that the voltage at the node 207 is equal to $V_{CC}/2+V_{BE}+V_L$. The same analysis applies for the node 220 in the $-I$ current source 31 of FIG. 6, and the node 303 of the $-2I$ current source 45 and the node 315 of the delta I current source 47 in FIG. 7.

The second current mirror 502 in the biasing means 23 is identical to the first current mirror 501 except that the $I_{CS}$ current source 516 is removed. This means that the current flowing through transistor 525 is equal to the current flowing through the transistor 503. Likewise, the current flowing through the transistor 526 is equal to the current flowing through the transistor 503. The current through transistor 526 is mirrored across the line VB2 in transistor 527 of FIG. 7; so the current through transistor 527 equals the current through transistor 503 of the biasing means 23. Since the resistor 528 above the node 306 is equal to one-half the total resistance defining the current through transistor 503, then following the analysis above, leaving out $V_L$, the voltage drop across resistor 528 is equal to $V_{CC}/2-V_{BE}$. This means that the voltage at the node 306 is equal to $V_{CC}/2+V_{BE}$. The biasing means 23 also includes the transistor 530 having its collector and emitter coupled and its base connected to the collector of transistor 504 and the transistor 531 having its collector and emitter coupled and base connected to the collector of transistor 525. These transistors supply capacitive load allowing the biasing means to more effectively reject $V_{CC}$.

IV.D. Floppy/Hard Clamp.

Figure 10:
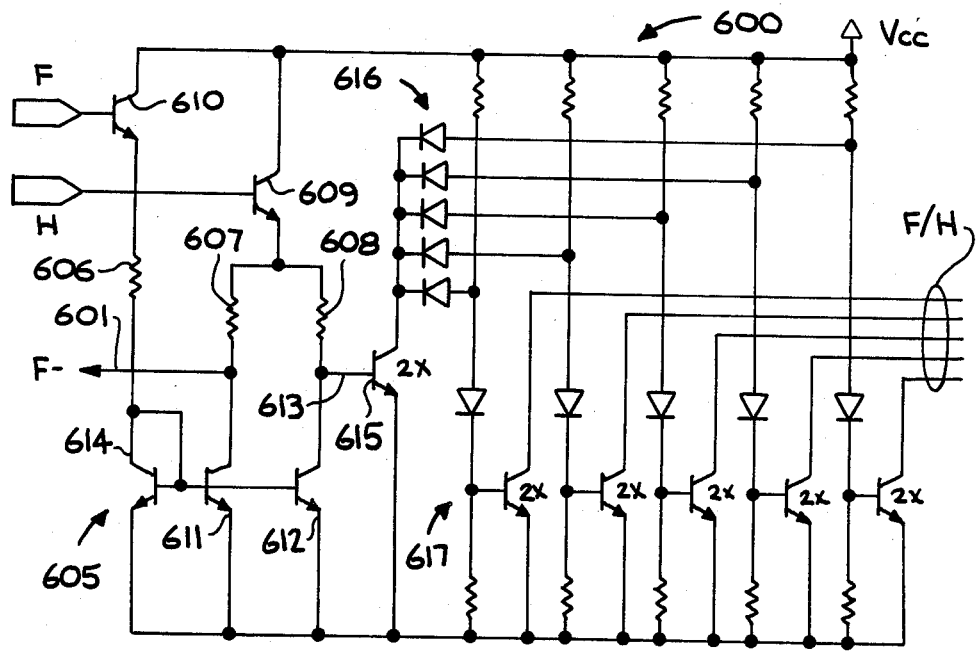

FIG. 10 shows the floppy/hard clamp circuit 600 or disabling means for disabling the positive current sources of the second bank in the current scaling means shown in FIG. 8 and disabling the positive current sources of the second bank shown in FIG. 5. The floppy/hard signals F/H basically supply a current through a saturated transistor which draws any current leakage from the positive current sources away from the second bank of current sources and the current mirrors for the hard disk mode. Also, the floppy/hard clamp circuit 600 supplies a signal F- across line 601 which controls the current scaling means 20 to disable the current mirror transistor 402.

The floppy/hard clamp 600 receives ECL logic signals F and H. When F is high, the apparatus is in the floppy mode, disabling the second bank of current sources. When H is high, the apparatus is in the hard disk mode, enabling the second bank of current sources.

First in the low frequency range, or floppy disk mode, signal F is high causing a high current through resistor 606 to the current mirror 605. The signal H is low so the voltage across the resistors 607 and 608 is less than the voltage across resistor 606. Thus, the current supplied through the transistor 609 is less than that supplied through the transistor 610. The current mirror transistor 611 and 612 thus draw current across lines 613 and 601 in order to attempt to match the current through transistor 614. This deprives the transistor 615 of base drive turning it off. Thus no current flows through the diode bank 616. Current thus is supplied to the base of the transistor bank 617 causing the transistors in the transistor bank 617 to saturate and draw current across the floppy/hard lines F/H to clamp off the positive current sources as discussed.

The transistor bank 617 includes five transistors in FIG. 10. Four of the outputs F/H are utilized in the apparatus 10 as shown in FIG. 8 and FIG. 5. The fifth floppy/hard clamp F/H can be utilized for instance in a low order phase detector such as that described in my related application entitled "LOW ORDER CHARGE PUMP FILTER", referred to above.

On the other hand, in the hard disk mode the signal H is high while the signal F is low. This causes a lower current to flow through the current mirrors 605 as defined through transistor 614. However, a high current is being supplied across resistors 607, 608 due to the higher voltage at the emitter of transistor 609. This causes current to flow out of lines 601, 613 providing base drive to transistor 615 which enables the diode bank 616 to divert current away from the bases of the transistor bank 617, thus turning them off and enabling the positive current sources.

The signal F- supplied on line 601 operates to enable transistor 620 shown in FIG. 8 or disable transistor 620 shown in FIG. 8. In the hard disk mode, transistor 620 is enabled, which turns off transistor 621 and allows the current ICO to flow through the current mirror transistor 402. However, in the floppy disk mode, transistor 620 is disabled, which turns on transistor 621 and prevents the current ICO from flowing into the current mirror transistor 402 by diverting it through line 625.

IV.E. Switching Control.

Figure 11:
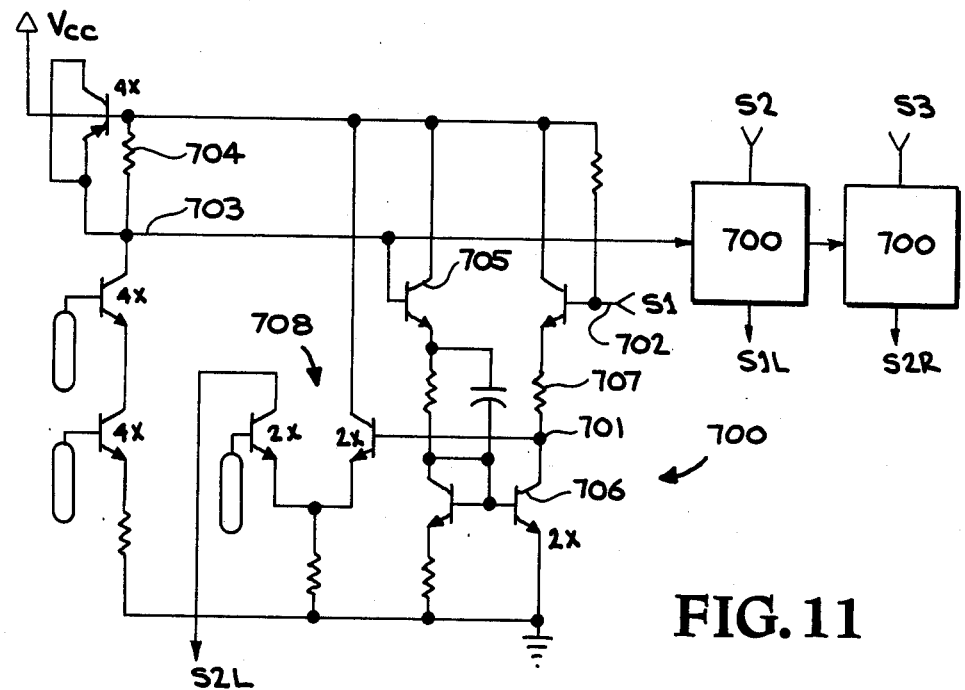
Figure 12:
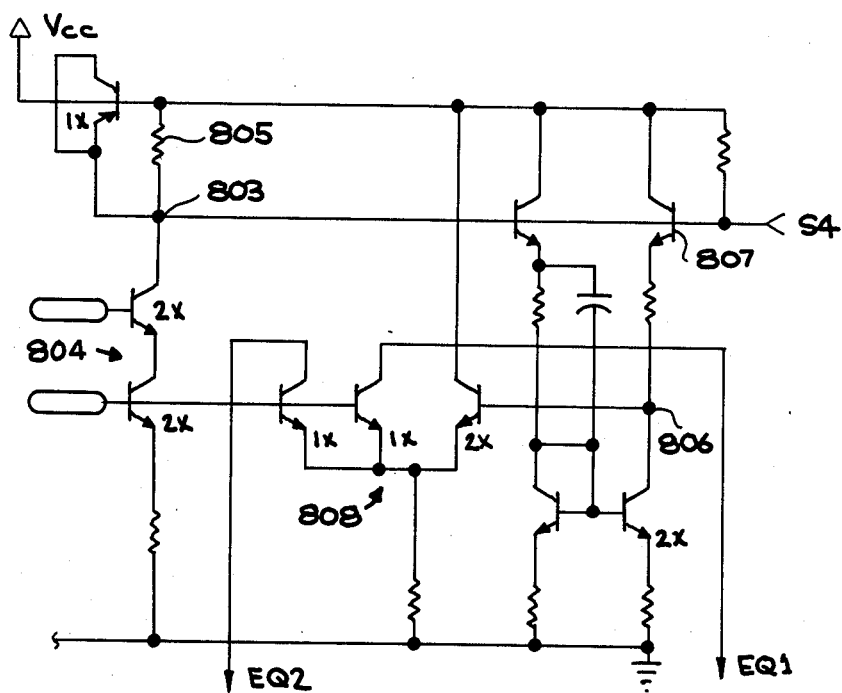

FIGS. 11 and 12 show the switching control circuits utilized in implementing the switching means 21, 22. FIG. 11 shows the implementation of the switching circuit for generating the switching signals S2L, S1L and S2R. Switching circuits for each is identical so only one is shown in detail. Switching circuits are designated 700. The switching circuit 700 supplying the output current S2L generates a current equal to $2I_{CS}$ across the line S2L when switching current S1 is supplied. This is accomplished by switching the node 701 from the level $V_{CS}+\frac{1}{2}V_L$ to $V_{CS}-\frac{1}{2}V_L$ by the signal S1 on line 702. The circuit operates by establishing a voltage at node 703 which is equal to $V_{CC}-1\frac{1}{2}V_L$. As can be seen, $4I_{CS}$ is flowing through the resistor 704 having a size of $\frac{3}{8}$ths of 2.49 K ohms or $\frac{3}{8}$ths of the standard ECL current source resistor. Thus the voltage drop across resistor 704 is equal to $4I_{CS} \times \frac{3}{8}$ths $R_{CS}$ or $1\frac{1}{2}V_L$. This bias node 703 establishes a current through transistor 705 which is equal to approximately $(V_{CC}-1\frac{1}{2}V_L-2V_{BE})/4.5$ K. This current is mirrored through transistor 706, having a 2X size and a half as big emitter resistor, so that the current through transistor 706 is double that through transistor 705. The voltage drop across the resistor 707 thus equals $2(V_{CC}-1\frac{1}{2}V_L-2V_{BE})2.25$ K/4.5 K or $V_{CC}-1\frac{1}{2}V_L-2V_{BE}$. Thus when the voltage at node 702 is equal to $V_{CC}$, the voltage at node 701 will equal $V_{CC}-V_{BE}-(V_{CC}-1\frac{1}{2}V_L-2V_{BE})$, or $1\frac{1}{2}V_L+V_{BE}$ which equals $V_{CS}+\frac{1}{2}V_L$. When current is supplied across line S1 to generate a one logic drop $V_L$ at node 702, the voltage at node 701 swings to $V_{CS}-\frac{1}{2}V_L$. Thus a symmetric switch for the current switch 708 is provided. The current switch 708 supplies a current $2I_{CS}$ across line S2L for generating a $2V_L$ swing in the current switch 37 of FIG. 6.

Likewise, the signal S1L and S2R supply a current equal to $2I_{CS}$ so that a $2V_L$ swing will occur in the current switch 44 of FIG. 6 and the current switch 51 of FIG. 7 through node 303.

FIG. 12 shows the switching circuit for the switching means 22 which generates the signals EQ2 and EQ1 for the equalizing mode. In the circuit of FIG. 12, the node 803 is held at $V_{CC}-2\frac{1}{2} V_L$. This is accomplished by providing a current equal to $2I_{CS}$ across current sources 804 through resistor 805 having a value equal to approximately 5/4ths of the standard current source resistor of 2.49 K. This results in the voltage at the node 806 being referenced to a level 1 $V_L$ above that of the node 701 described in FIG. 11. Thus the voltage at node 806 when the base of transistor 807 is at $V_{CC}$ will equal $V_{CS}+1\frac{1}{2} V_L$. To supply current across lines EQ1 and EQ2, the signal S4 supplies a current which drops the node 807 by two logic swings so that the node 806 will swing to $V_{CS}-\frac{1}{2} V_L$. This asymmetric switching at the node 806 provides a faster turnoff time and slows down the turn on time for the current switch 808 which is needed in equalizing mode.

IV.F. Output Current Driver.

Figure 13:
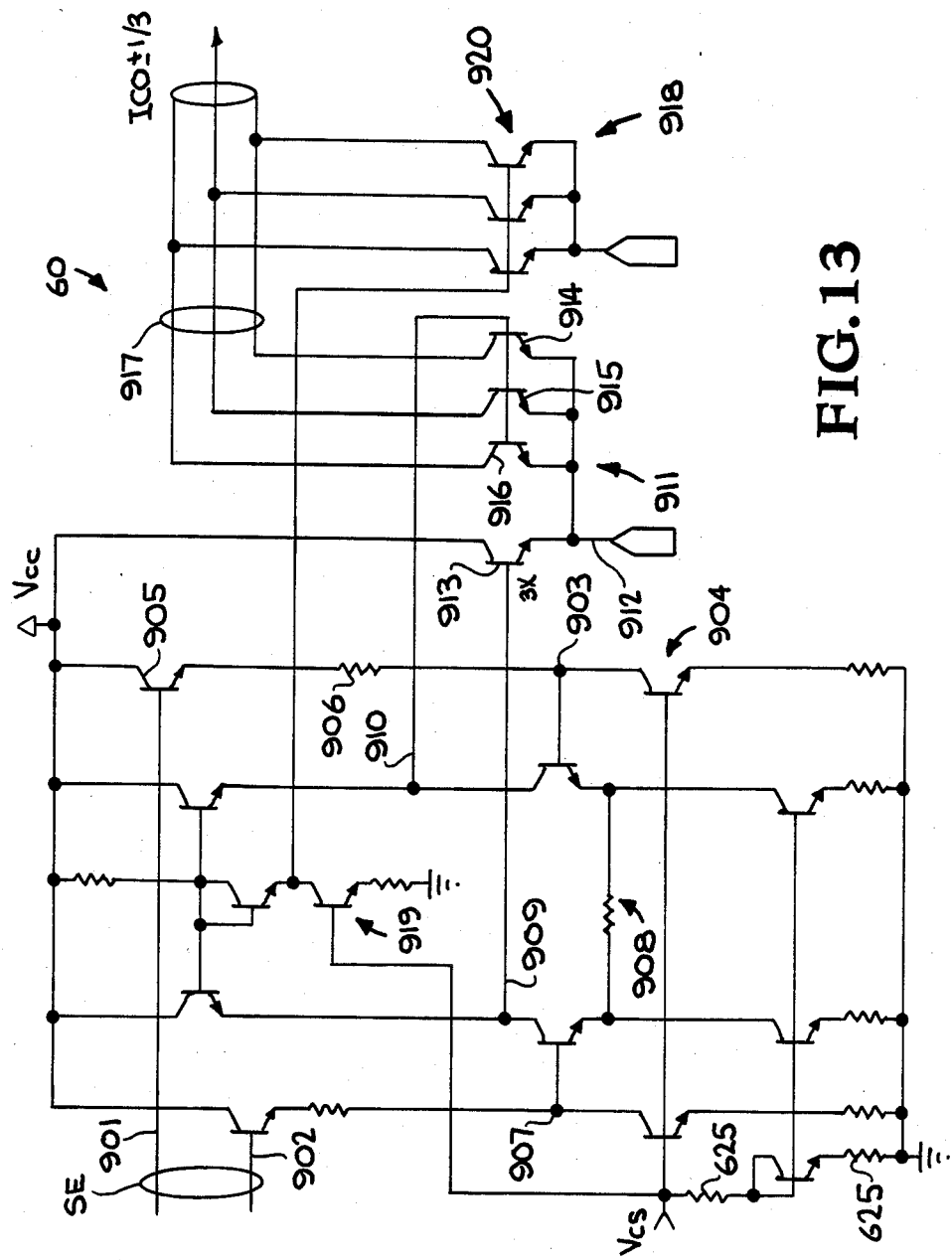

FIG. 13 shows the output current driver 60. As mentioned above, the error signal $S_E$ in the preferred embodiment is a differential voltage. Thus in FIG. 13 it is shown as supplied across lines 901 and 902. The voltage on line 901 is translated to a voltage at node 903. This occurs because a constant current equal to $I_{CS}$ is generated by the current source transistor 904. This constant current translates a voltage at the base of transistor 905 to a volage at the node 903 equals to 1 $V_{BE}-\frac{3}{4} V_L$ because resistor 906 has a resistance equal to three-quarters the standard current source resistor.

Likewise, the voltage at line 902 is translated to a voltage on node 907 equal to the voltage at node 902 minus 1 $V_{BE}-\frac{3}{4} V_L$. The voltage at the node 903 and 907 is supplied to the differential amplifier 908 which results in a differential voltage across nodes 909 and 910. The differential voltage across lines 909 and 910 drives a current divider 911. The current divider 911 receives $\frac{2}{3}$ ICO across line 912. The 3X transistor 913 is balanced against the three 1X transistors 914, 915, 916. Thus when the voltage on line 910 is higher than the voltage on line 909, the current to the collectors of transistors 914, 915 and 916 is higher than the current through the collector of line 913 by an amount proportional to the difference in voltage at the nodes 907 and 903, and vice versa. Thus the sum of the currents supplied across the three lines designated 914 varies from zero to $+\frac{2}{3}$ ICO.

The output current driver 60 includes a current source 918 supplying $\frac{2}{3}$ ICO for addition to the current supplied across lines 917 so that the output current is equal to ICO$\pm\frac{1}{3}$ ICO.

A biasing means 919 is supplied to keep the level of the base of the transistor bank 920 supplying $\frac{2}{3}$ ICO within a range close to the voltage supplied at lines 909 and 910. It can be seen that the node 920 will be held within a range of a few hundred milivolts of the voltage at the nodes 909 and 910.

The output current ICO$\pm\frac{1}{3}$ ICO can be used, for instance, in driving the VCO to vary the output frequency $f_{VCO}$ in response to a phase error between the reference frequency signal $f_{VCO}$ and the data stream $f_D$.

IV.G. Digital Control.

Figure 14:
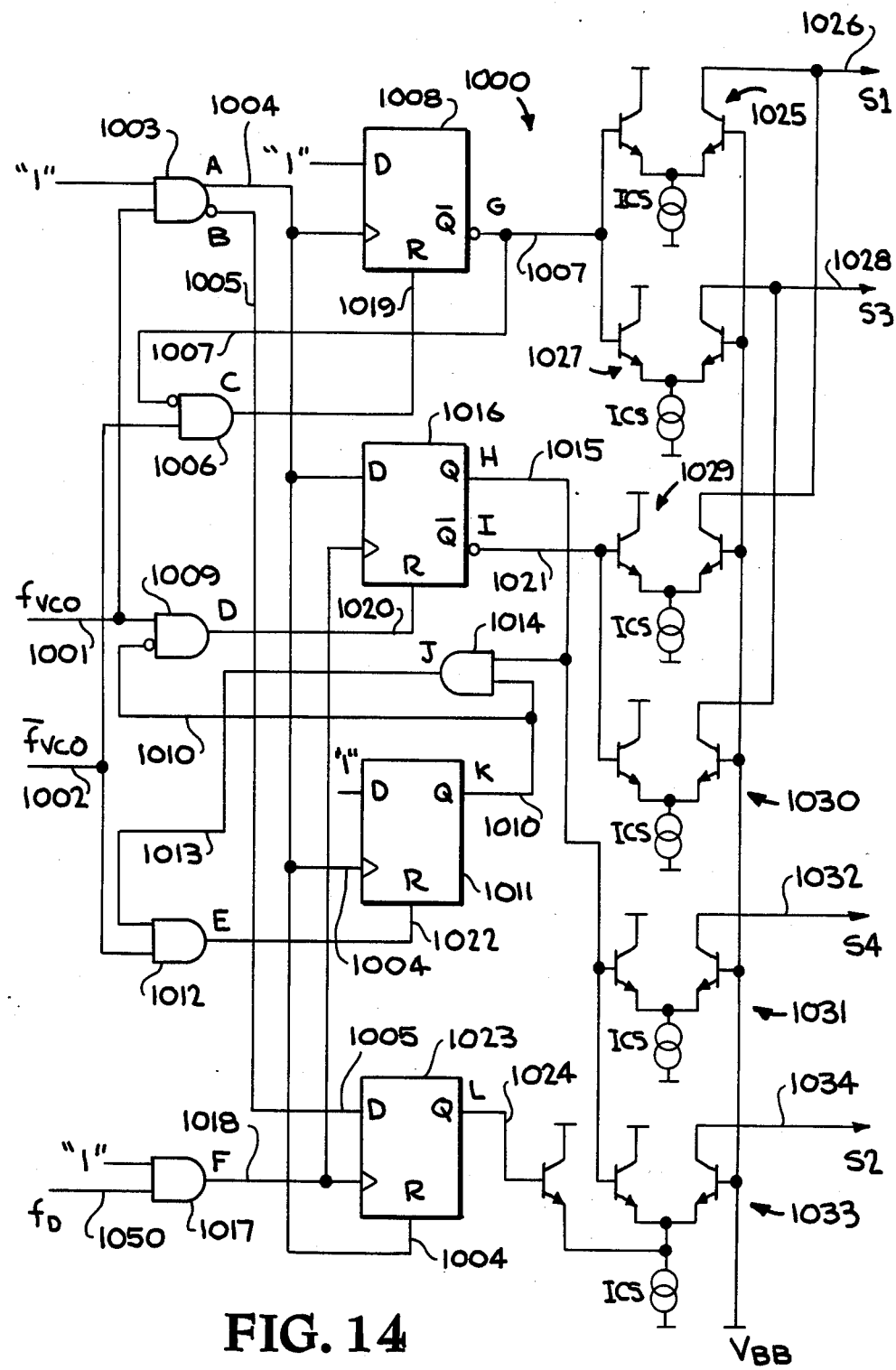
FIG. 14 shows one implementation of a digital control circuit for generating switching signals.

FIG. 14 shows a logic circuit 1000 implementing the digital control signals S1, S2, S3 and S4 for driving the switching means described with reference to FIGS. 11 and 12 when utilized as a phase detector for a phase-locked loop.

The phase-locked loop generates a signal $f_{VCO}$ received by the logic circuit 1000 on line 1001. Also received is the signal $\bar{f}_{VCO}$ on line 1002, which is the complement of $f_{VCO}$. Further, the logic circuit 1000 receives a signal $f_D$ which is the data stream on line 1050.

Figure 15:
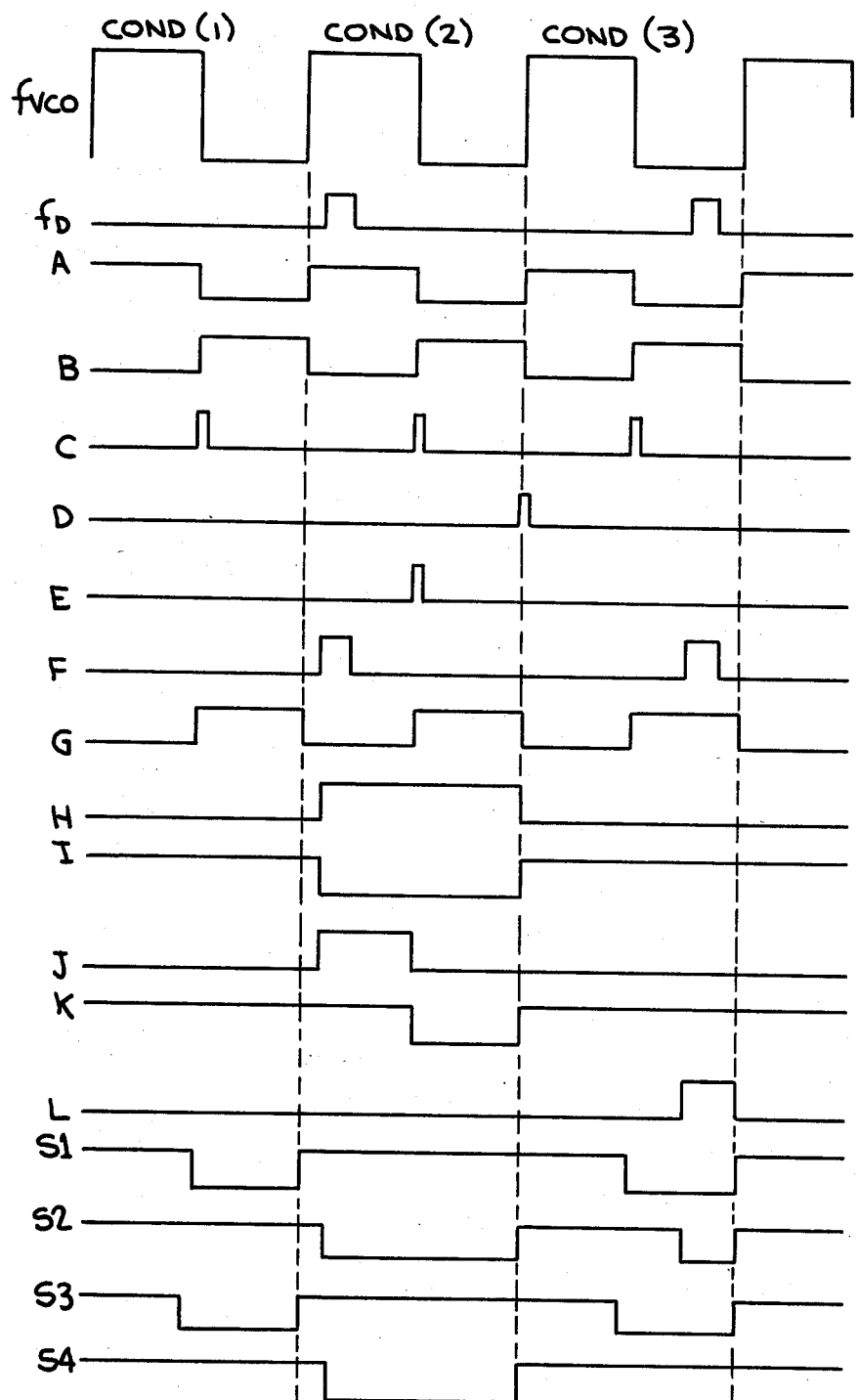
FIG. 15 is a timing diagram used to explain the operation of the digital control circuit of FIG. 14.

FIG. 15 shows a timing diagram used to describe the logic circuit 1000. The timing diagram in FIG. 15 shows the signals $f_{VCO}$, $f_D$, A through L and S1 through S4 that are labeled on the logic circuit 1000 in FIG. 14.

The logic circuit includes first AND gate 1003 which receives as input the signal $f_{VCO}$ on line 1001 and a constant high or "1" signal. The output of the first AND gates includes the signal A on line 1004 which is high when the signal $f_{VCO}$ is high, and the signal B on line 1005 which is the complement of signal A.

The logic circuit 1000 also includes a second AND gate 1006 which receives the signal $\bar{f}_{VCO}$ across line 1002 as one input. The other input is received across line 1007 and is inverted. The signal on line 1007 is the signal G generated by a D-type flip-flop 1008 described below.

A third AND gate 1009 receives as input the signal $f_{VCO}$ across line 1001 and as a second input across line 1010 the output K of the D-type flip-flop 1011 described below.

A fourth AND gate 1012 receives as input the signal $\bar{f}_{VCO}$ across line 1002 and the signal J across line 1013 which is generated by an AND gate 1014. The input to the AND gate 1014 is the signal K across line 1010 and the signal H across line 1015 generated by the D-type flip-flop 1016 described below.

A last AND gate 1017 receives as input the data stream $f_D$ across line 1050 and a constant high or "1" signal. The output of the AND gate 1017 is the signal F across line 1018.

The D-type flip-flop 1008 receives as its D input a constant high signal or "1", is clocked by the signal A across line 1004 and is reset by the signal C across line 1019. The $\bar{Q}$ output of the flip-flop 1008 is the signsal G across line 1007.

The D-type flip-flop 1016 receives as its D input the signal A across line 1004, is clocked by the signal F across line 1018 and is reset by the signal D across line 1020. The Q output of the D-type flip-flop 1016 is the signal H across line 1015. The $\bar{Q}$ output of the flip-flop 1016 is the signal I across line 1021.

The D-type flip-flop 1011 receives as its D input a constant high value or "1", is clocked by the signal A across line 1004 and is reset by the signal E across line 1022. The Q output of the flip-flop 1011 is the signal K across line 1010.

The D-type flip-flop 1023 receives as its D input the signal B across line 1005, is clocked by the signal F across line 1018 and is reset by the signal A across line 1004. The Q output of the D-type flip-flop 1023 is the signal L across line 1024.

The signal G across line 1007 drives a current switch 1025 for supplying the signal S1 across line 1026. Also the signal G across line 1007 drives the current switch 1027 which supplies a current for the signal S3 across line 1028. Both the current switches 1025 and 1027 are driven by an $I_{CS}$ current source which supplies the standard ECL current sufficient to cause a logic swing of about 0.75 volts across a 2.49K ohm resister.

The signal I across line 1021 drives a current switch 1029 for supplying a current connected to the line 1026 generating the signal S1. The current switch 1029 is driven by an $I_{CS}$ current source.

Signal I across line 1021 also drives the current source 1030 which supplies the current to the line 1028 generating the signal S3. The current switch 1030 is driven by an $I_{CS}$ current source.

The signal H across line 1015 drives a current switch 1031 which supplies current across line 1032 which corresponds to the signal S4. The current switch 1031 is driven by a current source supplying $2I_{CS}$, or double the standard ECL current.

The signal H across line 1015 and the signal L across line 1024 drive the current switch 1033 which supplies current across line 1034 corresponding to the signal S2. The current switch 1033 will generate a current on line 1034 only when both signal L and signal H are low. The current switch 1033 is driven by an ICS current source.

With reference to FIG. 15, the operation of the logic circuit 1000 shown in FIG. 14 will be explained in each of the three conditions of the charge-pump apparatus 10 described in FIG. 3.

In the first condition, condition (1), no data pulse signal is received during a cycle of the reference frequency signal $f_{VCO}$. In the second condition, condition (2), a data pulse signal is received during the first half-cycle of the reference frequency signal $f_{VCO}$. In the third condition, condition (3), a data pulse signal is received during the second half-cycle of the reference frequency signal $f_{VCO}$. The data pulse signals are shown as signal $f_D$ in FIG. 15.

The signal A is high when the signal $f_{VCO}$ is high and low when the signal $f_{VCO}$ is low.

The signal B is low when the signal $f_{VCO}$ is high and high when the signal $f_{VCO}$ is low.

The signal C is high only when the signal B is high and the signal G is low. The signal G is set low by the rising edge of signal A and reset high by signal C. Thus signal G remains low until the beginning of the second half-cycle of the reference frequency signal $f_{VCO}$ which drives the signal C high. When C goes high the signal G goes high which turns off the signal C.

The signal D is high only when the reference frequency signal $f_{VCO}$ is high and the signal K is low. The signal K is set high by leading edge of the signal A and reset by signal E. The signal E is only high during the second half-cycle of the reference frequency signal and when J is high. As explained below, J is only high when a data pulse signal is received during the first half-cycle of the reference frequency signal. Thus E goes high at the beginning of the second half-cycle of the reference frequency signal $f_{VCO}$ only when a data pulse has been received during the first half-cycle. E then causes the signal K to be reset low causing J to go low and E to go low.

The signal F is only high during a data pulse signal as can be seen.

The signal G as explained above is low during the first half-cycle of the reference frequency signal $f_{VCO}$, reset high by the signal C at the beginning of the second half-cycle of the reference frequency signal $f_{VCO}$ and clocked low again at the beginning of the first half-cycle of the reference frequency signal $f_{VCO}$.

The signal H is set high only during the first half-cycle of the reference frequency signal $f_{VCO}$ when a data pulse is received. It remains high until the signal D goes high, at which time it is reset low. Thus it is reset at the beginning of the first half-cycle of the reference frequency signal $f_{VCO}$ by the signal D.

The signal I is the complement of the signal H.

The signal J as explained above is set high only when signal K and signal H are high.

The signal K is clocked high by the leading edge of the reference frequency signal $f_{VCO}$ and reset low by the signal E as explained above.

The signal L is set high during the negative half-cycle of the reference frequency signal $f_{VCO}$ when a data pulse is received, and reset by the leading edge of the following cycle of the reference frequency signal $f_{VCO}$.

The signals S1 through S4 as shown in FIG. 15 are indicated as high when a current is flowing and low when no current is flowing. The signal S1 is generated, that is a current is supplied across line 1026 when either G is low or I is low.

The signal S2 is generated, that is current flows across line 1034, when both L and H are low.

The signal S4 is generated, that is current flows across line 1032, when signal H is low.

The signal S3 is generated, that is current flows across line 1028, like S1 when either G is low or I is low. When both G and I are low, the current supplied as signal S3 is doubled, however, this does not substantially interfere with switching.

When the signal S1 is high, the switch S2L is closed. Thus as can be seen, the signal S2L is controlled by the signal S1 and the signals correspond.

When the signal S2 is high, the switch S1L is closed. Thus the correspondence can be seen between the signal S2 in FIG. 15 and the switch S1L in FIG. 2.

The signal S3 controls the switch S2R. When the signal S3 is high, the signal S2R is closed.

The signal S4 controls the equalizing means. When the signal S4 is high, the equalizing switch is effectively open. Thus correspondence can be seen between the EQ switch shown in FIG. 2 and the signal S4 of FIG. 15.

V. Conclusion

The present invention provides an improved phase detector over the apparatus disclosed in my prior application entitled "PHASE DETECTOR", referred to above. The prior application disclosed an apparatus which required electronic filters which had to match precisely for both integrating nodes. Furthermore, the prior invention was difficult to implement within the 5 volt supply restrictions of the integrated circuit environment. Both of these problems of the prior invention are solved by the change in the phase detector architecture and switching sequence described above. The present invention is now a totally differential circuit, and only one side of the phase detector needs an electronic filter. Thus, the matching problems of the prior invention disappear.

The present invention utilizes a dual integrator as does the prior invention, but one of the integrating means has an inverted integration sequence and is referenced to a fixed bias level. This avoids an additional problem of the prior invention in which the integrating nodes had to track a variable DC level in a matched configuration.

Furthermore, the present invention is operable whether or not a data pulse occurs during a given period and does not need the time delay or arming devices of the prior art. Finally, the present invention is operable over a wide range of frequencies as a phase detector in a phase-locked loop without the use of a wide range of reference VCOs.

Finally, the phase-locked loop apparatus according to the present invention is operable over a wide range of data rates without the need for trimming components and external filters that must be changed to meet specifications for each different data rate.

The foregoing description of a preferred embodiment of the invention has been presented for purposes of illustration and description. It is not intended to be exhaustive or to limit to the invention to the precise form disclosed, and obviously many modifications and variations are possible in light of the above teaching. The embodiments involving hard disk and floppy disk magnetic storage media as sources of the data stream were chosen and described in order to best explain the principles of the invention and its practical application and to thereby enable others skilled in the art to best utilize the invention in various embodiments and with various modifications as are suited to the particular use contemplated. It is intended that the scope of the invention be defined by the claims appended hereto.

I claim:

1. An apparatus for generating an output signal in response to a sequence of control signals, comprising:
   first integrating means, coupled to receive a first subset of the sequence of control signals, for generating a first node voltage;
   second integrating means, coupled to receive a second subset of the sequence of control signals, for generating a second node voltage;
   output means, coupled to receive said first node voltage and said second node voltage, for generating the output signal in response to the difference between said first node voltage and said second node voltage; and
   filter means, coupled to receive said output signal from said output means and to said first integrating means, for supplying a current to said first integrating means proportional to the difference between said first node voltage and said second node voltage to vary said first node voltage.

2. The apparatus of claim 1, wherein said apparatus receives a first signal and a second signal and further including:
   control means, receiving the first signal and the second signal, for generating said sequence of control signals in response to a difference between the first signal and the second signal.

3. The apparatus of claim 1, wherein said second integrating means includes:
   equalizing means, responsive to a third subset of the sequence of control signals, for setting said second node voltage to a bias level.

4. The apparatus of claim 1, wherein said first integrating means includes:
   a first node having said first node voltage;
   a first charge storage means, connected from said first node to a reference voltage, for storing charge; and
   a first current source means, responsive to the first subset of the sequence of control signals, for supplying positive current, negative current or substantially no current to said first node for charging up, charging down or maintaining said first node voltage, respectively, at said first node; and wherein
   said second integrating means includes;
   a second charge storage means, connected from a second node to the reference voltage, for storing charge; and
   a second current source means, responsive th the second subset of the sequence of control signals, for supplying positive current, negative current or substantially no current to said second node for charging up, charging down or maintaining said second node voltage, respectively, at said second node; and
   bias means, responsive to a third subset of the sequence of control signals, for supplying current at said second node to set said second node voltage at a bias voltage.

5. The apparatus of claim 1, wherein said first and second integrating means have a frequency response and further including:
   means, coupled to said first and second integrating means, for varying the frequency response of said first and second integrating means.

6. The apparatus of claim 4, wherein said first and second integrating means have a frequency response and further including:
   current scaling means for varying the current supplied by said first current source means and said second current source means to vary the frequency response of said first integrating means and second integrating means.

7. The apparatus of claim 4, further including:
   means for supplying current for controlling drift of said first and second node voltages at said first node and said second node.

8. A phase detector apparatus for generating in response to a sequence of switching signals a phase error signal that indicates the difference in phase between a data signal and a frequency signal, comprising:
   a first node having a first node voltage;
   a first charge storage means, connected from the first node to a reference voltage, for storing charge to set said first node voltage;
   a first current source means, responsive to the sequence of switching signals, for suppling positive current, negative current or substantially no current to said first node for charging up, charging down or maintaining said first node voltage, respectively, at said first node;
   a second node having a second node voltage;
   a second charge storage means, connected from the second node to the reference voltage, for storing charge to set said second node voltage;
   a second current source means, responsive to the sequence of switching signals, for supplying positive current, negative current or substantially no current to said second node for charging up, charging down or maintaining said second node voltage, respectively, at said second node;
   equalizing means, responsive to the sequence of switching signals, for setting said second node voltage at a bias voltage;
   output means, coupled to said first node and said second node, for generating the phase error signal in response to the difference between said first node voltage and said second node voltage; and
   filter means, coupled to said output means and said first node, for supplying a current at said first node proportional to the difference between said first node voltage and said second node voltage.

9. The apparatus of claim 8, further including:
   switching means, coupled to receive the data signal and the frequency signal, for generating said sequence of switching signals in response to the data signal and the frequency signal.

10. The apparatus of claim 8, further including:

current scaling means for varying the current supplied by said first current source means and said second current source means to vary the frequency response of the phase detector apparatus.

11. The apparatus of claim 10, wherein said first current source means and said second current source means include:
a first bank of current sources and a second bank of current sources operable in conjunction to provide a high frequency range of operation and a low frequency range of operation; and
means for disabling at least one of said first and second banks to provide the low frequency range of operation.

12. The apparatus of claim 10, wherein said current scaling means comprises a plurality of current mirrors responsive to an input current; and
said first and second current source means generate currents proportional to said input current.

13. The apparatus of claim 8, wherein the data signal is a data stream of data pulse signals and said frequency signal defines a plurality of periods further including:
switching means for generating said switching signals in real time to define a first condition when no data pulse occurs during a given period, a second condition when a data pulse occurs late with respect to a given period and a third condition when a data pulse occurs early with respect to a given period.

14. The apparatus of claim 13, wherein the periods have a first half and a second half, and wherein:
said switching means controls said first current source means and said second current source means in said first condition so that said first node voltage at said first node and said second node voltage at said second node are charged down at a constant slope during the first half of the period, and charged up at a constant slope during the second half of the period so that there is essentially zero difference between said first node voltage and said second node voltage;
said switching means controls said first current source means and said second current source means during said second condition so that said first node voltage and said second node voltage are charged downward at a constant slope until the occurrence of the data pulse signal, then the first node voltage is substantially maintained at a level voltage and the second node voltage is set to the bias voltage until the end of the second half of the period; and
said switching means controls said first current source and said second current source during said third condition so that the first node voltage and the second node voltage are charged downward at a constant slope during the first half of the period, then charged up at a constant slope until the occurrence of the data pulse signal, then the first node voltage is charged up at two times the constant slope until the end of the second half of the period and the second node voltage is charged up at the constant slope until the end of the second half of the period.

15. The apparatus of claim 8, further including:
means for varying the frequency response of said phase detector apparatus.

16. In an integrated circuit, a phase detector for generating an analog error signal indicating the difference in phase between a data pulse in a data signal and a frequency pulse in a reference frequency signal, comprising:
first charge storage means for storing charge to set a first node voltage;
first scalable current source means, responsive to a sequence of switching signals, for supplying to said first charge storage means scaled positive current, negative current or substantially no current for charging up, charging down or maintaining said first node voltage;
second charge storage means for storing charge to set a second node voltage;
second scalable current source means, responsive to the sequence of switching signals, for supplying to said second charge storage means scaled positive current, negative current or substantially no current for charging up, charging down or maintaining said second node voltage;
bias means, responsive to the sequence of switching signals and connected to said second charge storage means, for setting said second node voltage at a bias voltage;
output means, coupled to said first charge storage means and said second charge storage means, for generating an analog error signal in response to the difference between said first node voltage and said second node voltage;
filter means, coupled to said output means, for supplying a current to said first charge storage means proportional to the difference between said first node voltage and said second node voltage; and
switching means, coupled to receive said data pulse and said frequency pulse, for generating said sequence of switching signals.

17. The apparatus of claim 16, wherein:
said switching means is responsive to digital control signals indicating the timing of the occurrence or indicating the non-occurrence of a data pulse with respect to a given frequency pulse.

18. The apparatus of claim 16, wherein:
said first and second scalable current source means include
current scaling means, responsive to a reference current, for generating a current scaling signal; and
variable current source means, responsive to the current scaling signal, for supplying a current equal to a multiple of the reference current.

19. The apparatus of claim 18, wherein:
said first current source means and said second current source means include
a first bank of current sources and a second bank of current sources operable in conjunction to provide a high frequency range of operation and a low frequency range of operation; and
means for disabling at least one of said first and second banks to provide the low frequency range of operation.

20. The apparatus of claim 16, wherein the data signal is a data stream of data pulse signals and said frequency signal defines a plurality of periods, further including:
switching means for generating said switching signals in real time to define a first condition when no data pulse occurs during a given period, a second condition when a data pulse occurs late with respect to a given period and a third condition when a data pulse occurs early with respect to a given period.

21. The apparatus of claim 20, wherein the periods have a first half and a second half, and wherein:

said switching means controls said first scalable current source means and said second scalable current source means in said first condition so that said first node voltage at said first node and said second node voltage at said second node are charged down at a constant slope during the first half of the period, and charged up at a constant slope during the second half of the period so that there is essentially zero difference between said first node voltage and said second node voltage;

said switching means controls said first scalable current source means and said second scalable current source means during said second condition so that said first node voltage and said second node voltage are charged downward at a constant slope until the occurrence of the data pulse signal, then the first node voltage is substantially maintained at a level voltage and the second node voltage is set to the bias voltage until the end of the second half of the period; and said switching means controls said first scalable current source and said second scalable current source during said third condition so that the first node voltage and the second node voltage are charged downward at a constant slope during the first half of the period, then charged up at a constant slope until the occurrence of the data pulse signal, then the first node voltage is charged up at two times the constant slope until the end of the second half of the period and the second node voltage is charged up at the constant slope until the end of the second half of the period.

* * * * *